US012720977B2

(12) United States Patent
Kim et al.

(10) Patent No.: US 12,720,977 B2
(45) Date of Patent: Aug. 25, 2026

(54) DISPLAY DEVICE AND TILED DISPLAY DEVICE WITH CONTACT HOLE FOR RECEIVING FAN-OUT LINES

(71) Applicant: Samsung Display Co., LTD., Yongin-si (KR)

(72) Inventors: Soo Youn Kim, Siheung-si (KR); Seung Hun Kim, Hwaseong-si (KR); Seung Yong Song, Suwon-si (KR); Hee Jun Yang, Hwaseong-si (KR); Kwan Hyuck Yoon, Seoul (KR); Seung Ho Yoon, Hwaseong-si (KR); Moon Won Chang, Yongin-si (KR); Se Hoon Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 883 days.

(21) Appl. No.: 17/856,464

(22) Filed: Jul. 1, 2022

(65) Prior Publication Data

US 2023/0143994 A1 May 11, 2023

(30) Foreign Application Priority Data

Nov. 10, 2021 (KR) ........................ 10-2021-0153882

(51) Int. Cl.
*H10K 59/131* (2023.01)
*H10K 59/18* (2023.01)
*H10K 59/12* (2023.01)

(52) U.S. Cl.
CPC ........... *H10K 59/131* (2023.02); *H10K 59/18* (2023.02); *H10K 59/1201* (2023.02)

(58) Field of Classification Search
CPC ... H10K 59/131; H10K 59/18; H10K 59/1201
See application file for complete search history.

(56) References Cited

U.S. PATENT DOCUMENTS

| | | | | |
|---|---|---|---|---|
| 11,903,270 B2 | 2/2024 | Kim et al. | | |
| 2011/0021029 A1 | 1/2011 | Kamp et al. | | |
| 2015/0286318 A1* | 10/2015 | Morein | ................. | G06F 3/0446 345/174 |

(Continued)

FOREIGN PATENT DOCUMENTS

| | | |
|---|---|---|
| KR | 10-2008-0027715 | 3/2008 |
| KR | 10-2012-0025299 | 3/2012 |

(Continued)

*Primary Examiner* — Lex H Malsawma
(74) *Attorney, Agent, or Firm* — Womble Bond Dickinson (US) LLP

(57) ABSTRACT

A display device includes a first substrate including a first contact hole, fan-out lines in a first metal layer, a second substrate on the first metal layer and including a second contact hole, connection lines in a second metal layer and into the second contact hole connected to the fan-out lines, a thin film transistor in an active layer and a third metal layer on the second metal layer, and a flexible film on a surface of the first substrate and into the first contact hole connected to the fan-out lines. An etching angle of the first contact hole between a top surface of the first substrate and an inner surface of the first contact hole is less than an etching angle of the second contact hole between top surfaces of the fan-out lines and an inner surface of the second contact hole.

12 Claims, 13 Drawing Sheets

(56) References Cited

U.S. PATENT DOCUMENTS

| | | | | |
|---|---|---|---|---|
| 2016/0079287 | A1 | 3/2016 | Yan et al. | |
| 2017/0025444 | A1* | 1/2017 | Hirakata | H10K 59/40 |
| 2017/0179159 | A1* | 6/2017 | Kawata | H10D 86/441 |
| 2017/0256600 | A1* | 9/2017 | Sano | H10K 77/10 |
| 2017/0338246 | A1* | 11/2017 | Kubota | G02F 1/136286 |
| 2018/0012549 | A1* | 1/2018 | Lee | G09G 3/3266 |
| 2018/0138260 | A1* | 5/2018 | Kajiyama | H10K 77/10 |
| 2018/0247994 | A1* | 8/2018 | Seo | H10D 86/441 |
| 2019/0035820 | A1* | 1/2019 | Yanaka | H10D 86/423 |
| 2019/0131377 | A1* | 5/2019 | Kwon | H10K 59/1213 |
| 2020/0020585 | A1 | 1/2020 | Wakahara et al. | |
| 2020/0127073 | A1* | 4/2020 | Ke | H10D 86/441 |
| 2021/0159303 | A1* | 5/2021 | Li | H10K 71/80 |
| 2022/0050506 | A1* | 2/2022 | Gehlen | G06F 1/1656 |
| 2022/0052078 | A1* | 2/2022 | Kim | H01L 25/0753 |
| 2022/0052079 | A1* | 2/2022 | Jang | H01L 25/18 |
| 2022/0093881 | A1* | 3/2022 | Yueh | H10K 77/111 |
| 2022/0181384 | A1* | 6/2022 | Park | H10H 20/857 |
| 2023/0033837 | A1* | 2/2023 | Cha | H10H 20/857 |
| 2023/0187582 | A1* | 6/2023 | Noh | H10H 20/8312<br>257/79 |
| 2024/0251616 | A1 | 7/2024 | Kim et al. | |

FOREIGN PATENT DOCUMENTS

| | | | | |
|---|---|---|---|---|
| KR | 10-2017-0015773 | | 2/2017 | |
| KR | 10-2021-0113478 | A | 9/2021 | |
| WO | WO-2021182681 | A1 * | 9/2021 | H01L 25/0753 |

* cited by examiner

DPL: TFTL, EML, WLCL, CFL
TFT: SE, GE, ACT, DE
MTL1: FOL1
MTL2: CWL1, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL2
MTL2: CWL2
ACTL: ACT, DE, SE
MTL3: GE
MTL4: CNE1, CNE2

DPL
30
ARF
TFE
PV3
BK2
OC2
PV2
BK1
PAS3
SB
PAS1
OC1
PV1
ILD
GI
BF
BIL3
SUB2
BIL2
BIL1
SUB1
III'
III
DA
SM
BA
LA2
LA3
CF2
CF1
CF3
20
BK2
BK1
WLC2
WLC1
LTU
SB
BP PAS2 BP
CTE1
CTE2
RME1
RME2
ED
A1
CWL3
CWL4
CNT1
CNT2
CNT3
FOL3
FOL4
ACF
LDE1
LDE2
10-1
10-2
ADM
FPCB3
X
Y
Z

NDA DA
BA LA1 BA LA2 BA LA3 BA
ARF
TFE
CF1 BK2 CF2 CF3
PV3 BK2 CFL
OC2
WLC1 BK1 WLC2 LTU
PV2 BK1 WLCL
PAS3 SB PAS1 EML
CTE2 CTE1 SB BP PAS2 BP SB RME2 ED RME1
OC1 PV1 ILD GI BF TFTL
CNT3 CWL1 CNE2 CNE1
BIL3 SUB2
VL1 VL2 VL1 VL2
BIL2 BIL1
SE GE ACT DE
SUB1
FOL1 CNT1 CNT2 LDE ACF
ADM GIC FPCB1

DISPLAY DEVICE AND TILED DISPLAY DEVICE WITH CONTACT HOLE FOR RECEIVING FAN-OUT LINES

CROSS-REFERENCE TO RELATED APPLICATION(S)

This application claims priority to and benefits of Korean Patent Application No. 10-2021-0153882 under 35 U.S.C. § 119 filed on Nov. 10, 2021, in the Korean Intellectual Property Office, the entire contents of which are incorporated herein by reference.

BACKGROUND

1. Technical Field

The disclosure relates to a display device, a method of manufacturing the same, and a tiled display device including the same.

2. Description of the Related Art

With the advance of an information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel may include a light emitting element that emits light by itself, an image can be displayed without a backlight unit providing light to the display panel.

In case that the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting display devices having a relatively small size. The tiled display device may include a boundary portion called a seam between the display devices, due to a non-display area or a bezel area of each of the display devices adjacent to each other. In case that a single image is displayed on the entire screen, the boundary portion between the display devices gives a sense of disconnection over the entire screen, thereby reducing a sense of immersion in the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that prevents damage to a metal layer exposed through a contact hole penetrating a substrate in a process of forming the contact hole, a method of manufacturing the same, and a tiled display device including the same.

Aspects of the disclosure also provide a tiled display device that removes a sense of disconnection between display devices and improving a sense of immersion in an image, by preventing the recognition of boundary portions or non-display areas between the display devices.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, a display device may comprise a first substrate comprising a first contact hole; fan-out lines disposed in a first metal layer on the first substrate; a second substrate disposed on the first metal layer and comprising a second contact hole; connection lines disposed in a second metal layer on the second substrate, the connection lines electrically connected to the fan-out lines through the second contact hole, respectively; a thin film transistor disposed in an active layer and a third metal layer disposed on the second metal layer; and at least one flexible film disposed on a bottom surface of the first substrate, the at least one flexible film electrically connected to the fan-out lines through the first contact hole. An etching angle of the first contact hole between a top surface of the first substrate and an inner surface of the first contact hole may be less than an etching angle of the second contact hole between top surfaces of the fan-out lines and an inner surface of the second contact hole.

The etching angle of the first contact hole may be about 10 degrees or less, and the etching angle of the second contact hole may be about 30 degrees or more.

The display device may further comprise a gate driver disposed on a first flexible film disposed on an edge of the first substrate. The first flexible film may supply a gate signal received from the gate driver to a first connection line among the connection lines through a first fan-out line among the fan-out lines.

The first connection line may be electrically connected to a gate electrode of the thin film transistor disposed in the third metal layer.

The at least one flexible film may comprise flexible films. The display device may comprise a data driver disposed on a second flexible film disposed on another edge adjacent to an edge of the first substrate among the flexible films. The second flexible film may supply a data voltage or a power voltage received from the data driver to a second connection line among the connection lines through a second fan-out line among the fan-out lines.

The second connection line may be electrically connected to a drain electrode of the thin film transistor disposed in the active layer.

The display device may further comprise a voltage line disposed in the second metal layer; and a connection electrode disposed in a fourth metal layer on the third metal layer. An end of the connection electrode may be electrically connected to the voltage line, and another end of the connection electrode may be electrically connected to the thin film transistor.

According to an embodiment, a tiled display device may comprise a first display device and a second display device, the first display device and the second display device being adjacent to each other, the first display device and the second display device may each comprise a display area having pixels and a non-display area adjacent to the display area; and a bonding part that bonds the first display device to the second display device. The first display device and the second display device may each comprise a first substrate comprising a first contact hole; a fan-out line disposed in a first metal layer on the first substrate; a second substrate disposed on the first metal layer and comprising a second contact hole; a connection line disposed in a second metal layer on the second substrate, the connection line being electrically connected to the fan-out line through the second contact hole; a thin film transistor disposed in an active layer and a third metal layer on the second metal layer; and a flexible film disposed on a bottom surface of the first substrate, the flexible film being electrically connected to the fan-out line through the first contact hole. An end of the flexible film may be electrically connected to the fan-out line of the first display device, and another end of the flexible film may be electrically connected to the fan-out line of the second display device.

An etching angle of the first contact hole between a top surface of the first substrate and an inner surface of the first contact hole may be less than an etching angle of the second contact hole between a top surface of the fan-out line and an inner surface of the second contact hole.

An etching angle of the first contact hole may be about 10 degrees or less, and the etching angle of the second contact hole may be about 30 degrees or more.

At least a part of the flexible film may overlap the bonding part in a thickness direction.

The first display device may comprise a gate driver or a data driver disposed on a bottom surface of the first substrate. The second display device may receive a gate signal of the gate driver or a data voltage of the data driver through the flexible film.

According to an embodiment, a method of manufacturing a display device may comprise providing a first substrate; forming a fan-out line disposed on the first substrate; forming a second substrate on the fan-out line; stacking a display layer on the second substrate; etching a surface of the first substrate through a first etching process and forming a residual layer of the first substrate; etching the residual layer of the first substrate through a second etching process to form a first contact hole of the first substrate; and inserting a flexible film into the first contact hole to electrically connect the flexible film to the fan-out line. An etching angle of the first contact hole between a top surface of the first substrate and an inner surface of the first contact hole may be about 10 degrees or less.

The first etching process may be an atmospheric pressure plasma process using an etching gas containing fluorine (F) radicals in a proportion of about 5% or more with respect to a total gas.

The first etching process may be an atmospheric pressure plasma process using an etching gas containing at least one of nitrogen trifluoride (NF3), carbon tetrafluoride (CF4), fluoromethane (CH3F), and difluoromethane (CH2F2).

The second etching process may be an atmospheric pressure plasma process using an etching gas that does not contain the fluorine (F) radicals.

The first etching process may be a laser etching process, and the second etching process may be an atmospheric pressure plasma process using an etching gas that does not contain fluorine (F) radicals.

The forming of the residual layer of the first substrate may comprise forming a residual layer having a thickness about 30% or less of a thickness of the first substrate.

An etching rate of the second etching process may be about 1/6 or less of an etching rate of the first etching process.

The forming of the second substrate may comprise forming a second contact hole penetrating the second substrate. The stacking of the display layer may comprise forming a connection line disposed on the second substrate into the second contact hole. An etching angle of the first contact hole may be less than an etching angle of the second contact hole between a top surface of the fan-out line and an inner surface of the second contact hole.

In accordance with the display device, the method of manufacturing the same, and the tiled display device including the same according to the embodiments, the contact hole penetrating the substrate is formed by two etching processes having different etching rates, so that it is possible to prevent damage to the metal layer exposed through the contact hole and ensure reliability by facilitating the contact between the metal layer and a connection film.

In accordance with the display device, the method of manufacturing the same, and the tiled display device including the same according to the embodiments, the area of the non-display area of the display device may be minimized by electrically connecting a gate driver or a data driver disposed under or below a substrate to a fan-out line disposed on the substrate. Accordingly, in the tiled display device, by minimizing the gap between the display devices, it is possible to prevent a user from recognizing the boundary portions or the non-display areas between the display devices.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
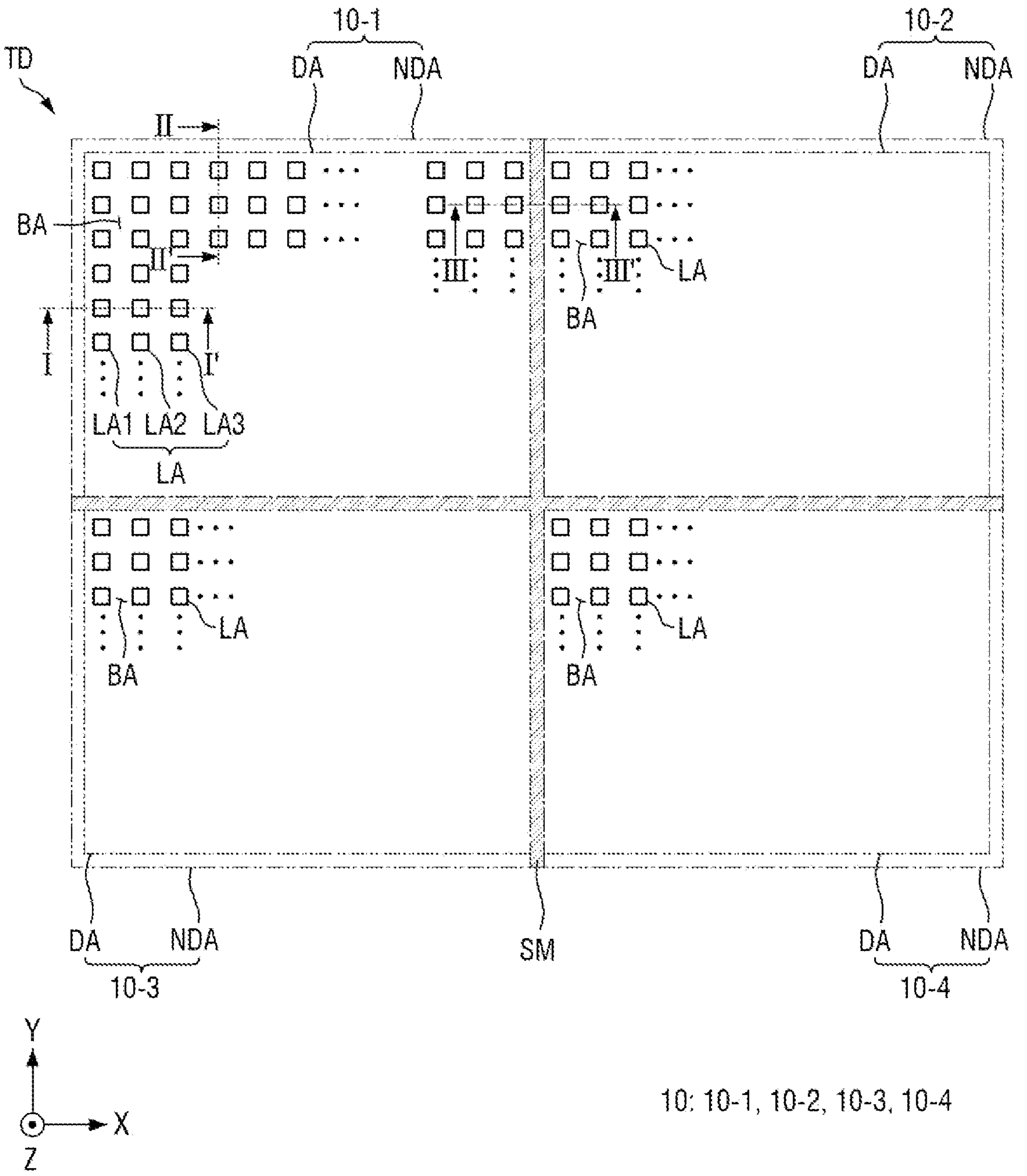
FIG. 1 is a schematic plan view illustrating a tiled display device according to one embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the systems, apparatuses, methods, etc. disclosed herein. It is apparent, however, that various embodiments may be practiced without these details or with one or more equivalent arrangements. In other instances, structures and devices may be shown in block diagram form, as necessary, in order to avoid unnecessarily obscuring various embodiments. Further, various embodiments may be different from what is set forth herein and implementations of the disclosure are not necessarily limited to the embodiments set forth herein. For example, shapes, configurations, and characteristics of an embodiment may be used or implemented in other embodiments without departing from the disclosure.

Unless otherwise specified, the illustrated embodiments represent one or more ways in which the disclosure may be practiced. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, while the shapes, angles, thicknesses, and relative sizes of elements may be exaggerated for clarity and/or descriptive purposes, it should be understood that each figure, including the shapes, angles, thicknesses and relative sizes of the various illustrated elements may represent at least one specific example of how the disclosure may be implemented. In case that an embodiment may be implemented differently, a specific process order may be performed differently from the described order. For example, two consecutively described processes may be performed substantially at the same time or performed in an order opposite to the described order. Also, like reference numerals may denote like elements throughout the specification and the figures.

In case that an element, such as a layer, is referred to as being "on," "connected to," or "coupled to" another element or layer, it may be directly on, connected to, or coupled to the other element or layer or intervening elements or layers may be present. In case that, however, an element or layer is referred to as being "directly on," "directly connected to," or "directly coupled to" another element or layer, there are no intervening elements or layers present. As used herein, the term "connected" may refer to physical, electrical, and/or fluid connection, with or without intervening elements.

Further, the X-axis, the Y-axis, and the Z-axis are not necessarily limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

Although the terms "first," "second," and the like may be used herein to describe various types of elements, these elements should not necessarily be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or at other orientations), and, as such, the spatially relative descriptors used herein should be interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Moreover, the terms "comprises," "comprising," "includes," and/or "including," "has", "have" and/or "having" and variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art. For example, "about" may mean within one or more standard deviations, or within ±30%, 20%, 10%, 5% of the stated value.

Various embodiments may be described herein with reference to sectional and/or exploded illustrations that are schematic illustrations of idealized embodiments and/or intermediate structures. As such, variations from the shapes of the illustrations as a result, for example, of manufacturing techniques and/or tolerances, may be present. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions might not reflect actual shapes of regions of a device. However, it is to be understood that none of the above statements should be interpreted as meaning that the figures do not show actual embodiments of the disclosure and indeed the various shapes, angles, thicknesses, relative sizes, etc. are indeed indented to represent at least one embodiment of the disclosure and so the geometric relationships illustrated may be taken as disclosing an example embodiment of the disclosure. It is noted that the disclosure is not necessarily limited to the arrangements shown and variations are to be understood as falling within the scope of the disclosure.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (for example, microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (for example, one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, detailed embodiments will be described with reference to the accompanying drawings.

FIG. 1 is a schematic plan view illustrating a tiled display device according to one embodiment.

Referring to FIG. 1, a tiled display device TD may include display devices 10. The display devices 10 may be arranged or disposed in a grid form, but are not limited thereto. The display devices 10 may be connected in the first direction (X-axis direction) or the second direction (Y-axis direction), and the tiled display device TD may have a particular shape. For example, the display devices 10 may have a same size, but are not limited thereto. For another example, the display devices 10 may have different sizes.

The tiled display device TD may include first to fourth display devices 10-1 to 10-4. The number and connection relationship of the display devices 10 are not limited to the embodiment of FIG. 1. The number of the display devices 10 may be determined according to the size of each of the display devices 10 and the tiled display device TD.

Each of the display devices 10 may have a rectangular shape including long sides and short sides. The display devices 10 may be arranged or disposed such that the long sides or the short sides thereof are connected to each other. Some or a number of the display devices 10 may be disposed at the edge of the tiled display device TD to form one side or a side of the tiled display device TD. Some others or a number of the display devices 10 may be disposed at corners of the tiled display device TD to form two adjacent sides of the tiled display device TD. Some others or a number of the display devices 10 may be disposed on the inner side of the tiled display device TD, and may be surrounded by other display devices 10.

Each of the display devices 10 may include a display area DA and a non-display area NDA. The display area DA may include pixels to display an image. Each of the pixels may include an organic light emitting diode including an organic light emitting layer, a micro LED, a quantum dot light emitting diode including a quantum dot light emitting layer, or an inorganic light emitting element including an inorganic semiconductor. In the following, the case where each of the pixels may include an inorganic light emitting element will be described, but the disclosure is not limited thereto. The non-display area NDA may be disposed around the display area DA to surround or to be adjacent to the display area DA, and may not display an image.

The display device 10 may include pixels arranged or disposed along rows and columns in the display area DA. Each of the pixels may include an emission area LA defined by a pixel defining layer or bank, and may emit light having a peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light having a peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in the range from about 610 nm to about 650 nm, the second color light may be green light having a peak wavelength in the range from about 510 nm to about 550 nm, and the third color light may be blue light having a peak wavelength in the range from about 440 nm to about 480 nm, but the disclosure is not limited thereto.

The first to third emission areas LA1, LA2, and LA3 may be sequentially arranged or disposed repetitively in the first direction (X-axis direction) in the display area DA. For example, the size of the third emission area LA3 may be larger than that of the first emission area LA1, and the size of the first emission area LA1 may be larger than that of the second emission area LA2. However, the disclosure is not limited thereto. For another example, the first emission area LA1, the second emission area LA2, and the third emission area LA3 may be substantially the same in size.

The display area DA of the display device 10 may include a light blocking area BA surrounding the emission areas LA. The light blocking area BA may prevent the colored lights emitted from the first to third emission areas LA1, LA2, and LA3 from mixing with one another.

The tiled display device TD may have a planar shape as a whole, but is not limited thereto. The tiled display device TD may have a three-dimensional shape to provide a three-dimensional effect to a user. For example, in case that the tiled display device TD has a three-dimensional shape, at least some or a number of the display devices 10 may have a curved shape. For another example, the display devices 10 may each have a planar shape and may be connected to each other at an angle, so that the tiled display device TD may have a three-dimensional shape.

The tiled display device TD may include a coupling area SM disposed between display areas DA. The tiled display device TD may be formed by connecting non-display areas NDA of the adjacent display devices 10. The display devices 10 may be connected to each other through a bonding part or an adhesive member disposed in the coupling area SM. Each of the coupling areas SM of the display devices 10 may not include a pad member or a flexible film attached to the pad member. Accordingly, the distance between the display areas DA of the display devices 10 may be small enough that the coupling area SM between the display devices 10 is not recognized by the user. The reflectance of external light of the display areas DA of the display devices 10 may be substantially the same as that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

Figure 2:
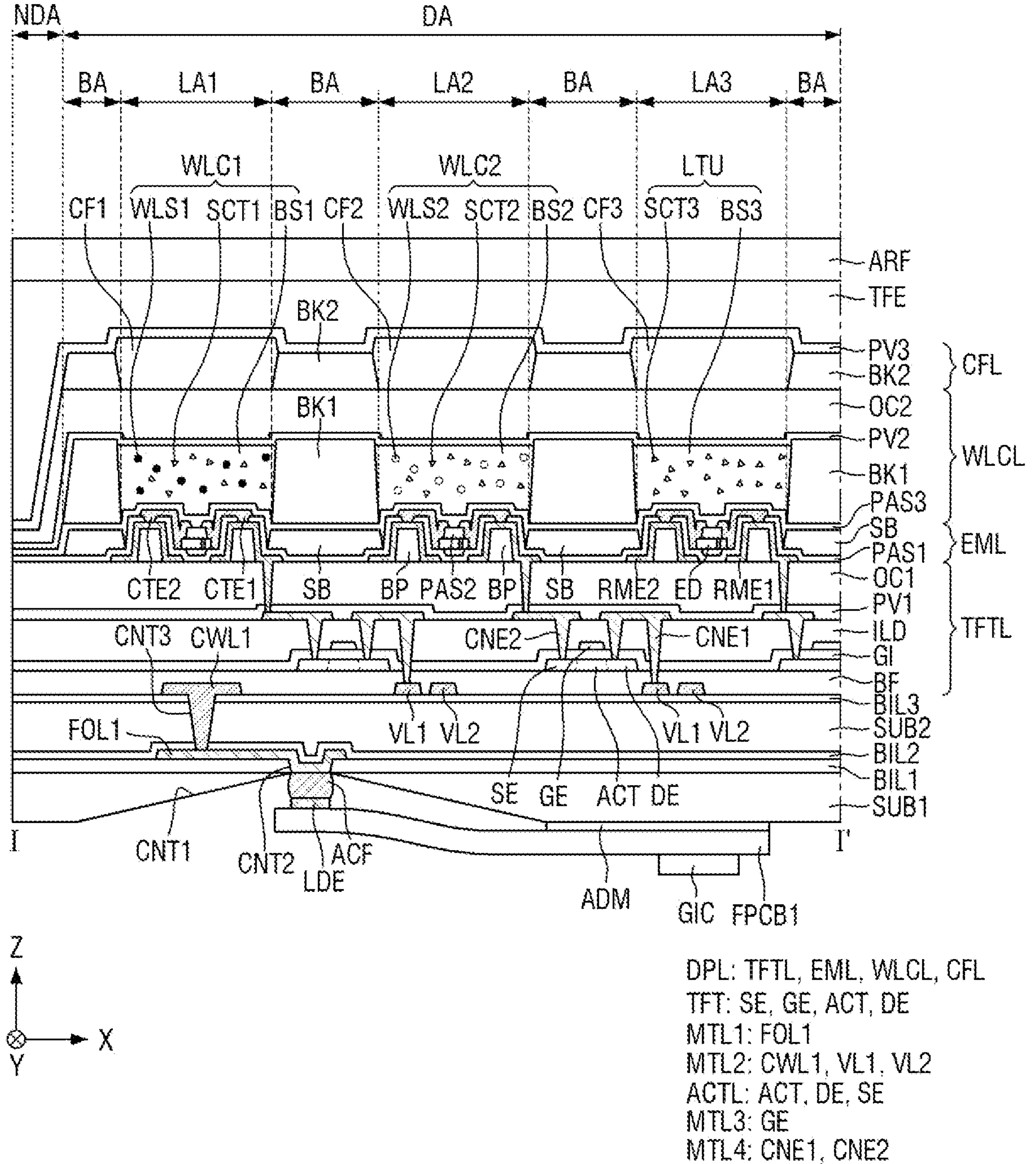
FIG. 2 is a schematic cross-sectional view taken along line I-I' of FIG. 1.

FIG. 2 is a schematic cross-sectional view taken along line I-I' of FIG. 1.

Referring to FIG. 2, the display area DA of the display device 10 may include the first to third emission areas LA1, LA2, and LA3. Each of the first to third emission areas LA1, LA2, and LA3 may be an area in which light generated from the light emitting element ED of the display device 10 is emitted to the outside of the display device 10.

The display device 10 may include a first substrate SUB1, a first barrier insulating layer BIL1, a first metal layer MTL1, a second barrier insulating layer BIL2, a second substrate SUB2, a third barrier insulating layer BIL3, a display layer DPL, an encapsulation layer TFE, an anti-reflection film ARF, a first flexible film FPCB1, and a gate driver GIC.

The first substrate SUB1 may support the display device 10. The first substrate SUB1 may be a base substrate or a base member. The first substrate SUB1 may be a flexible substrate which can be bent, folded or rolled. For example, the first substrate SUB1 may include an insulating material such as a polymer resin such as polyimide (PI), but the disclosure is not limited thereto. As another example, the first substrate SUB1 may be a rigid substrate including a glass material.

The first substrate SUB1 may include the first contact hole CNT1. The first contact hole CNT1 may be etched from the bottom surface of the first substrate SUB1 to penetrate the top surface of the first substrate SUB1. For example, the lower width of the first contact hole CNT1 may be greater than the upper width of the first contact hole CNT1. In the manufacturing process of the display device 10, the bottom surface of a first fan-out line FOL1 inserted into a second contact hole CNT2 may be exposed by the first contact hole CNT1, and the first fan-out line FOL1 may be electrically connected to a lead electrode LDE of the first flexible film FPCB1 through a connection film ACF inserted into the first contact hole CNT1.

The first barrier insulating layer BIL1 may be disposed on the first substrate SUB1. The first barrier insulating layer BIL1 may include an inorganic layer that prevents permeation of air or moisture. For example, the first barrier insulating layer BIL1 may include at least one of a silicon nitride layer, a silicon oxynitride layer, a silicon oxide layer, a titanium oxide layer, an aluminum oxide layer, or an amorphous silicon layer, but the disclosure is not limited thereto.

The first barrier insulating layer BIL1 may include the second contact hole CNT2. The second contact hole CNT2 may be etched from the top surface of the first barrier insulating layer BIL1 to penetrate the bottom surface of the first barrier insulating layer BIL1. For example, the upper width of the second contact hole CNT2 may be greater than the lower width of the second contact hole CNT2.

The first metal layer MTL1 may be disposed on the first barrier insulating layer BIL1. The first metal layer MTL1 may include the first fan-out line FOL1. For example, the first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first fan-out line FOL1 may electrically connect the first flexible film FPCB1 to a first connection line CWL1. The first fan-out line FOL1 may be electrically connected to the first flexible film FPCB1 through the connection film ACF. The first fan-out line FOL1 may be electrically connected to a gate line through the first connection line CWL1. The gate line may be connected to the gate electrode of a thin film transistor TFT. Accordingly, the first fan-out line FOL1 may supply the gate signal received from the gate driver GIC of the first flexible film FPCB1 to the thin film transistor TFT of the pixel through the first connection line CWL1. The display device 10 may include the first fan-out line FOL1 disposed in the display area DA, so that the area of the non-display area NDA may be minimized.

The second barrier insulating layer BIL2 may be disposed on the first barrier insulating layer BIL1 and the first metal layer MTL1. The second barrier insulating layer BIL2 may include an inorganic layer that prevents permeation of air or moisture. For example, the second barrier insulating layer BIL2 may include at least one of a silicon nitride layer, a silicon oxynitride layer, a silicon oxide layer, a titanium oxide layer, an aluminum oxide layer, or an amorphous silicon layer, but the disclosure is not limited thereto.

The second substrate SUB2 may be disposed on the second barrier insulating layer BIL2. The second substrate SUB2 may be a base substrate or a base member. The second substrate SUB2 may be a flexible substrate which can be bent, folded or rolled. For example, the second substrate SUB2 may include an insulating material such as a polymer resin such as polyimide (PI), but the disclosure is not limited thereto.

The third barrier insulating layer BIL3 may be disposed on the second substrate SUB2. The third barrier insulating layer BIL3 may include an inorganic layer that prevents permeation of air or moisture. For example, the third barrier insulating layer BIL3 may include at least one of a silicon nitride layer, a silicon oxynitride layer, a silicon oxide layer, a titanium oxide layer, an aluminum oxide layer, or an amorphous silicon layer, but the disclosure is not limited thereto.

The third barrier insulating layer BIL3, the second substrate SUB2, and the second barrier insulating layer BIL2 may include a third contact hole CNT3. The third contact hole CNT3 may be etched from the top surface of the third barrier insulating layer BIL3 to penetrate the bottom surface of the second barrier insulating layer BIL2. For example, the upper width of the third contact hole CNT3 may be greater than the lower width of the third contact hole CNT3. In the manufacturing process of the display device 10, the top surface of the first fan-out line FOL1 may be exposed by the third contact hole CNT3, and the first fan-out line FOL1 may be in contact with the first connection line CWL1 inserted into the third contact hole CNT3.

The display layer DPL may be disposed on the third barrier insulating layer BIL3. The display layer DPL may include a thin film transistor layer TFTL, a light emitting element layer EML, a wavelength conversion layer WLCL and a color filter layer CFL. The thin film transistor layer TFTL may include a second metal layer MTL2, a buffer layer BF, an active layer ACTL, a gate insulating layer GI, a third metal layer MTL3, an interlayer insulating layer ILD, a fourth metal layer MTL4, a first passivation layer PV1, and a first planarization layer OC1.

The second metal layer MTL2 may be disposed on the third barrier insulating layer BIL3. The second metal layer MTL2 may include the first connection line CWL1 and first and second voltage lines VL1 and VL2. The first connection line CWL1 and the first and second voltage lines VL1 and VL2 may be formed of a same material or a similar material in a same layer, but the disclosure is not limited thereto. For example, the second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first connection line CWL1 may be inserted into the third contact hole CNT3 to be connected to the first fan-out line FOL1. For example, the first connection line CWL1 may be connected to the gate line to supply a gate signal to a gate electrode GE of the thin film transistor TFT. Accordingly, the first connection line CWL1 may supply the gate signal received from the gate driver GIC to the thin film transistor TFT of the pixel through the first fan-out line FOL1.

The first and second voltage lines VL1 and VL2 may extend in the second direction (Y-axis direction) in the display area DA. Each of the first and second voltage lines VL1 and VL2 may be electrically connected to the thin film transistor TFT or the light emitting element ED. For example, each of the first and second voltage lines VL1 and VL2 may be a data line, a driving voltage line, a low potential line, or an initialization voltage line, but is not limited thereto.

The buffer layer BF may be disposed on the second metal layer MTL2 and the third barrier insulating layer BIL3. The buffer layer BF may include an inorganic material that prevents permeation of air or moisture. For example, the buffer layer BF may include inorganic layers laminated alternately each other.

The active layer ACTL may be disposed on the buffer layer BF. The active layer ACTL may include a semiconductor region ACT, a drain electrode DE, and a source electrode SE of the thin film transistor TFT. The semiconductor region ACT may overlap the gate electrode GE in the thickness direction (Z-axis direction), and may be insulated from the gate electrode GE by the gate insulating layer GI. The drain electrode DE and the source electrode SE may be provided by making a material of the semiconductor region ACT conductive. The thin film transistor TFT may constitute a pixel circuit of each of the pixels. For example, the thin film transistor TFT may be a switching transistor or a driving transistor of the pixel circuit.

The gate insulating layer GI may be disposed on the active layer ACTL and the buffer layer BF. The gate insulating layer GI may insulate the gate electrode GE from the semiconductor region ACT of the thin film transistor TFT. The gate insulating layer GI may include a contact hole through which each of the first and second connection electrodes CNE1 and CNE2 passes.

The third metal layer MTL3 may be disposed on the gate insulating layer GI. The third metal layer MTL3 may include the gate electrode GE of the thin film transistor TFT. The gate electrode GE may overlap the semiconductor region ACT with the gate insulating layer GI interposed therebetween. The gate electrode GE may receive a gate signal from the gate line. For example, the third metal layer MTL3 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The interlayer insulating layer ILD may be disposed on the third metal layer MTL3. The interlayer insulating layer ILD may insulate the third and fourth metal layers MTL3 and MTL4. The interlayer insulating layer ILD may include a contact hole through which each of the first and second connection electrodes CNE1 and CNE2 passes.

The fourth metal layer MTL4 may be disposed on the interlayer insulating layer ILD. The fourth metal layer MTL4 may include the first and second connection electrodes CNE1 and CNE2. The first and second connection electrodes CNE1 and CNE2 may be formed of a same material or a similar material in a same layer, but the disclosure is not limited thereto. For example, the fourth metal layer MTL4 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first connection electrode CNE1 may connect the first voltage line VL1 to the drain electrode DE of the thin film transistor TFT. One end or an end of the first connection electrode CNE1 may be in contact with the first voltage line VL1 of the second metal layer MTL2, and the other end or another end of the first connection electrode CNE1 may be in contact with the drain electrode DE of the active layer ACTL.

The second connection electrode CNE2 may connect the source electrode SE of the thin film transistor TFT to a first electrode RME1. The second connection electrode CNE2 may be in contact with the source electrode SE through the contact hole provided in the interlayer insulating layer ILD and the gate insulating layer GI.

The first passivation layer PV1 may be disposed on the fourth metal layer MTL4 and the interlayer insulating layer ILD. The first passivation layer PV1 may protect the thin film transistor TFT. The first passivation layer PV1 may include a contact hole through which the first electrode RME1 passes.

The first planarization layer OC1 may be disposed on the first passivation layer PV1 to flatten the upper end of the thin film transistor layer TFTL. For example, the first planarization layer OC1 may include a contact hole through which the first electrode RME1 passes. Here, the contact hole of the first planarization layer OC1 may be connected to the contact hole of the first passivation layer PV1. The first planarization layer OC1 may contain an organic insulating material such as polyimide (PI).

The light emitting element layer EML may be disposed on the thin film transistor layer TFTL. The light emitting element layer EML may include a protruding pattern BP, the first electrode RME1, a second electrode RME2, a first insulating layer PAS1, a sub-bank SB, the light emitting element ED, a second insulating layer PAS2, a first contact electrode CTE1, a second contact electrode CTE2, and a third insulating layer PAS3.

The protruding pattern BP may be disposed on the first planarization layer OC1. The protruding pattern BP may protrude from the top surface of the first planarization layer OC1. Protruding patterns BP may be disposed in an opening area or the emission area LA of each of the pixels. Light emitting elements ED may be arranged or disposed between the protruding patterns BP. The protruding pattern BP may have inclined side surfaces, and the light emitted from the light emitting elements ED may be reflected by the first and second electrodes RME1 and RME2 arranged or disposed on the protruding patterns BP. For example, the protruding pattern BP may include an organic insulating material such as polyimide (PI).

The first electrode RME1 may be disposed on the first planarization layer OC1 and the protruding pattern BP. The first electrode RME1 may be disposed on the protruding pattern BP located or disposed on one side or on a side of the light emitting elements ED. The first electrode RME1 may be disposed on the inclined surfaces of the protruding pattern BP and reflect the light emitted from the light emitting element ED. The first electrode RME1 may be inserted into the contact hole provided in the first planarization layer OC1 and the first passivation layer PV1 and connected to the second connection electrode CNE2. The first electrode RME1 may be electrically connected to one end or an end of the light emitting element ED through the first contact electrode CTE1. For example, the first electrode RME1 may receive a voltage that is proportional to the luminance of the light emitting element ED from the thin film transistor TFT of the pixel.

The second electrode RME2 may be disposed on the first planarization layer OC1 and the protruding pattern BP. The second electrode RME2 may be disposed on the protruding pattern BP located or disposed on the other side or on another side of the light emitting elements ED. The second electrode RME2 may be disposed on the inclined surfaces of the protruding pattern BP and reflect the light emitted from the light emitting element ED. The second electrode RME2 may be electrically connected to the other end of the light emitting element ED through the second contact electrode CTE2. For example, the second electrode RME2 may receive a low potential voltage supplied from a low potential line to all the pixels.

The first and second electrodes RME1 and RME2 may contain a conductive material having high reflectivity. For example, the first and second electrodes RME1 and RME2 may contain at least one of aluminum (Al), silver (Ag), copper (Cu), nickel (Ni), or lanthanum (La). For another example, the first and second electrodes RME1 and RME2 may include a material such as indium tin oxide (ITO), indium zinc oxide (IZO), and indium tin zinc oxide (ITZO). In another example, the first and second electrodes RME1 and RME2 may contain layers including a transparent conductive material layer and a metal layer having high reflectivity, or may include one layer or a layer containing a transparent conductive material or a metal having high reflectivity. The first and second electrodes RME1 and RME2 may have a stacked structure of ITO/Ag/ITO, ITO/Ag/IZO, ITO/Ag/ITZO/IZO, or the like within the spirit and the scope of the disclosure.

The first insulating layer PAS1 may be disposed on the first planarization layer OC1, and the first and second electrodes RME1 and RME2. The first insulating layer PAS1 may protect and insulate the first electrode RME1 and the second electrode RME2 from each other. The first insulating layer PAS1 may prevent damage caused by direct contact between the light emitting element ED and the first and second electrodes RME1 and RME2 in an alignment process of the light emitting element ED.

The sub-bank SB may be disposed in the light blocking area BA on the first insulating layer PAS1. The sub-bank SB may be disposed at the boundary of the pixels to distinguish the light emitting elements ED of each of the pixels. The sub-bank SB may have a height and may contain an organic insulating material such as polyimide (PI).

The light emitting elements ED may be arranged or disposed on the first insulating layer PAS1. The light emitting elements ED may be arranged or disposed in parallel to each other between the first electrode RME1 and the second electrodes RME2. The length of the light emitting element ED may be greater than the length between the first electrode RME1 and the second electrodes RME2. The light emitting element ED may include semiconductor layers, and one end or an end and the other end or another end opposite to one end or an end may be defined with respect to any one semiconductor layer. One end or an end of the light emitting element ED may be disposed on the first electrode RME1, and the other end or another end of the light emitting element ED may be disposed on the second electrode RME2. One end or an end of the light emitting element ED may be electrically connected to the first electrode RME1 through the first contact electrode CTE1, and the other end of the light emitting element ED may be electrically connected to the second electrode RME2 through the second contact electrode CTE2.

The light emitting element ED may have a micro-meter or nano-meter size, and may be an inorganic light emitting diode including an inorganic material. The inorganic light emitting diode may be aligned between the first electrode RME1 and the second electrode RME2 facing each other by the electric field formed in a specific or given direction between the first electrode RME1 and the second electrode RME2.

For example, light emitting elements ED may include active layers having a same material or a similar material and emit light of a same wavelength band or light of a same color. The lights emitted from the first to third emission areas LA1, LA2, and LA3 of the light emitting element layer EML may have a same color. For example, the light emitting elements ED may emit light of a third color or blue light having a peak wavelength in the range of about 440 nm to about 480 nm, but the disclosure is not limited thereto.

The second insulating layer PAS2 may be disposed on the light emitting elements ED. For example, the second insulating layer PAS2 may partially surround the light emitting elements ED and may not cover or overlap both ends of the light emitting elements ED. The second insulating layer PAS2 may protect the light emitting elements ED, and may fix the light emitting elements ED in the manufacturing process of the display device 10. The second insulating layer PAS2 may fill the space between the light emitting element ED and the first insulating layer PAS1.

The first contact electrode CTE1 may be disposed on the first insulating layer PAS1, and may be connected to the first electrode RME1 while being inserted into the contact hole provided in the first insulating layer PAS1. For example, the contact hole of the first insulating layer PAS1 may be disposed on the protruding pattern BP, but the disclosure is not limited thereto. One end or an end of the first contact electrode CTE1 may be connected to the first electrode RME1 on the protruding pattern BP, and the other end or another end of the first contact electrode CTE1 may be connected to one end or an end of the light emitting element ED.

The second contact electrode CTE2 may be disposed on the first insulating layer PAS1, and may be connected to the second electrode RME2 while being inserted into the contact hole provided in the first insulating layer PAS1. For example, the contact hole of the first insulating layer PAS1 may be disposed on the protruding pattern BP, but the disclosure is not limited thereto. One end or an end of the second contact electrode CTE2 may be connected to the other end of the light emitting element ED, and the other end or another end of the second contact electrode CTE2 may be connected to the second electrode RME2 on the protruding pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed at the upper end of the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion member WLC1, a second wavelength conversion member WLC2, a light transmission member LTU, a second passivation layer PV2, a second planarization layer OC2, or the like within the spirit and the scope of the disclosure.

The first light blocking member BK1 may be disposed in the light blocking area BA on the third insulating layer PAS3. The first blocking member BK1 may overlap the sub-bank SB in the thickness direction (Z-axis direction). The first light blocking member BK1 may block transmission of light. The first light blocking member BK1 may prevent light infiltration and color mixture between the first to third emission areas LA1, LA2, and LA3, which leads to the improvement of color reproducibility of the display device 10. The first light blocking member BK1 may be arranged or disposed in the form of a grid surrounding the first to third emission areas LA1, LA2, and LA3 in a plan view.

The first wavelength conversion member WLC1 may be disposed in the first emission area LA1 on the third insulating layer PAS3. The first wavelength conversion member WLC1 may be surrounded by the first light blocking member BK1. The first wavelength conversion member WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of about 610 nm to about 650 nm and emit the red light. The first wavelength shifter WLS1 may be a quantum dot, a quantum rod, or a fluorescent substance. The quantum dot may be a particulate material that emits light of a specific or given color in case that an electron transitions from a conduction band to a valence band.

A part of the blue light emitted from the light emitting element layer EML may pass through the first wavelength conversion member WLC1 without being converted to red light by the first wavelength shifter WLS1. Among the blue light emitted from the light emitting element layer EML, the light incident on the first color filter CF1 without being converted by the first wavelength conversion member WLC1 may be blocked by the first color filter CF1. The red light produced by the first wavelength conversion member WLC1 converting the blue light emitted from the light emitting element layer EML may pass through the first color filter CF1 to be emitted to the outside. Accordingly, the red light may be emitted through the first emission area LA1.

The second wavelength conversion member WLC2 may be disposed in the second emission area LA2 on the third insulating layer PAS3. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of a same material or a similar material as the first base resin BS1, or may be made of a material in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. For example, the second scatterer SCT2 may be made of a same material or a similar material as the first scatterer SCT1, or may be made of a material in association with the first scatterer SCT1.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of about 510 nm to about 550 nm and emit the green light. The second wavelength shifter WLS2 may be a quantum dot, a quantum rod, or a fluorescent substance. The second wavelength shifter WLS2 may contain the materials in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the third insulating layer PAS3. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of a same material or a similar material as the first base resin BS1 or the second base resin BS2, or may be made of a material in association with the first base resin BS1.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. For example, the third scatterer SCT3 may be formed of a same material or a similar material as the first scatterer SCT1 or the second scatterer SCT2, or may be made of a material in association with the first scatterer SCT1.

Since the wavelength conversion layer WLCL is disposed directly on the third insulating layer PAS3 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be readily aligned in the first to third emission areas LA1, LA2, and LA3, respectively, and the thickness of the display device 10 may be relatively reduced.

The second passivation layer PV2 may cover or overlap the first and second wavelength conversion members WLC1 and WLC2, the light transmission member LTU, and the first light blocking member BK1. For example, the second passivation layer PV2 may seal the first and second wavelength conversion members WLC1 and WLC2 and the light transmission member LTU to prevent the first and second wavelength conversion members WLC1 and WLC2 and the light transmission member LTU from damage or contamination. For example, the second passivation layer PV2 may contain an inorganic material.

The second planarization layer OC2 may be disposed on the second passivation layer PV2 to flatten the upper ends of the first and second wavelength conversion members WLC1 and WLC2 and the light transmission member LTU. For example, the second planarization layer OC2 may contain an organic insulating material such as polyimide (PI).

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed in the light blocking area BA on the second planarization layer OC2 of the wavelength conversion layer WLCL. The second blocking member BK2 may overlap the first blocking member BK1 or the sub-bank SB in the thickness direction (Z-axis direction). The second light blocking member BK2 may block transmission of light. The second light blocking member BK2 may prevent light infiltration and color mixture between the first to third emission areas LA1, LA2, and LA3, which leads to the improvement of color reproducibility of the display device 10. The second light blocking member BK2 may be arranged or disposed in the form of a grid surrounding the first to third emission areas LA1, LA2, and LA3 in a plan view.

The first color filter CF1 may be disposed in the first emission area LA1 on the second planarization layer OC2. The first color filter CF1 may be surrounded by the second light blocking member BK2. The first color filter CF1 may overlap the first wavelength conversion member WLC1 in the thickness direction (Z-axis direction). The first color filter CF1 may selectively allow the first color light (for example, red light) to pass therethrough, and block or absorb the second color light (for example, green light) and the third color light (for example, blue light). For example, the first color filter CF1 may be a red color filter and contain a red colorant.

The second color filter CF2 may be disposed in the second emission area LA2 on the second planarization layer OC2. The second color filter CF2 may be surrounded by the second light blocking member BK2. The second color filter CF2 may overlap the second wavelength conversion member WLC2 in the thickness direction (Z-axis direction). The second color filter CF2 may selectively allow the second color light (for example, green light) to pass therethrough, and block or absorb the first color light (for example, red light) and the third color light (for example, blue light). For example, the second color filter CF2 may be a green color filter and contain a green colorant.

The third color filter CF3 may be disposed in the third emission area LA3 on the second planarization layer OC2. The third color filter CF3 may be surrounded by the second light blocking member BK2. The third color filter CF3 may overlap the light transmission member LTU in the thickness direction (Z-axis direction). The third color filter CF3 may selectively allow the third color light (for example, blue light) to pass therethrough, and block or absorb the first color light (for example, red light) and the second color light (for example, green light). For example, the third color filter CF3 may be a blue color filter and contain a blue colorant.

The first to third color filters CF1, CF2, and CF3 may absorb a part of the light coming from the outside of the display device 10 to reduce the reflected light of the external light. Thus, the first to third color filters CF1, CF2, and CF3 can prevent color distortion caused by the reflection of the external light.

Since the first to third color filters CF1, CF2, and CF3 are directly disposed on the second planarization layer OC2 of the wavelength conversion layer WLCL, the display device 10 may not require a separate substrate for the first to third color filters CF1, CF2, and CF3. Therefore, the thickness of the display device 10 may be relatively reduced.

The third passivation layer PV3 may cover or overlap the first to third color filters CF1, CF2, and CF3. The third passivation layer PV3 may protect the first to third color filters CF1, CF2, and CF3.

The encapsulation layer TFE may be disposed on the third passivation layer PV3 of the color filter layer CFL. The encapsulation layer TFE may cover or overlap the top and side surfaces of the display layer DPL. For example, the encapsulation layer TFE may include at least one inorganic layer to prevent permeation of oxygen or moisture. The encapsulation layer TFE may include at least one organic layer to protect the display device 10 from foreign substances such as dust.

The anti-reflection film ARF may be disposed on the encapsulation layer TFE. The anti-reflection film ARF may prevent reflection of external light, thereby reducing a decrease in visibility due to reflection of external light. The anti-reflection film ARF may protect the top surface of the display device 10. The anti-reflection film ARF may be omitted. For another example, the anti-reflection film ARF may be replaced with a polarizing film.

The first flexible film FPCB1 may be disposed under or below the first substrate SUB1. The first flexible film FPCB1 may be disposed at one edge or an edge of the first substrate SUB1. The first flexible film FPCB1 may be attached to the bottom surface of the first substrate SUB1 using an adhesive member ADM. If necessary, the adhesive member ADM may be omitted. One edge or an edge of the first flexible film FPCB1 may be inserted into the first contact hole CNT1. The first flexible film FPCB1 may include the lead electrode LDE disposed on the top surface of one side or a side. The lead electrode LDE may be inserted into the first contact hole CNT1. The first flexible film FPCB1 may support the gate driver GIC disposed on the bottom surface of the other side or another side. The lead electrode LDE may be electrically connected to the gate driver GIC through a lead line (not shown) disposed on the bottom surface of the first flexible film FPCB1. The lead electrode LDE may be electrically connected to the first fan-out line FOL1 through the connection film ACF. The other side of the first flexible film FPCB1 may be connected to a source circuit board (not shown) under or below the first substrate SUB1. The first flexible film FPCB1 may transmit the gate signal of the gate driver GIC to the display device 10.

The gate driver GIC may be mounted on the first flexible film FPCB1. The gate driver GIC may be an integrated circuit (IC). The gate driver GIC may generate gate signals based on the gate control signal, and may sequentially supply the gate signals to the gate lines GL according to a set order. The display device 10 may include the first fan-out line FOL1 disposed on the first substrate SUB1 and the gate driver GIC disposed under or below the first substrate SUB1, so that the area of the non-display area NDA may be minimized.

Figure 3:
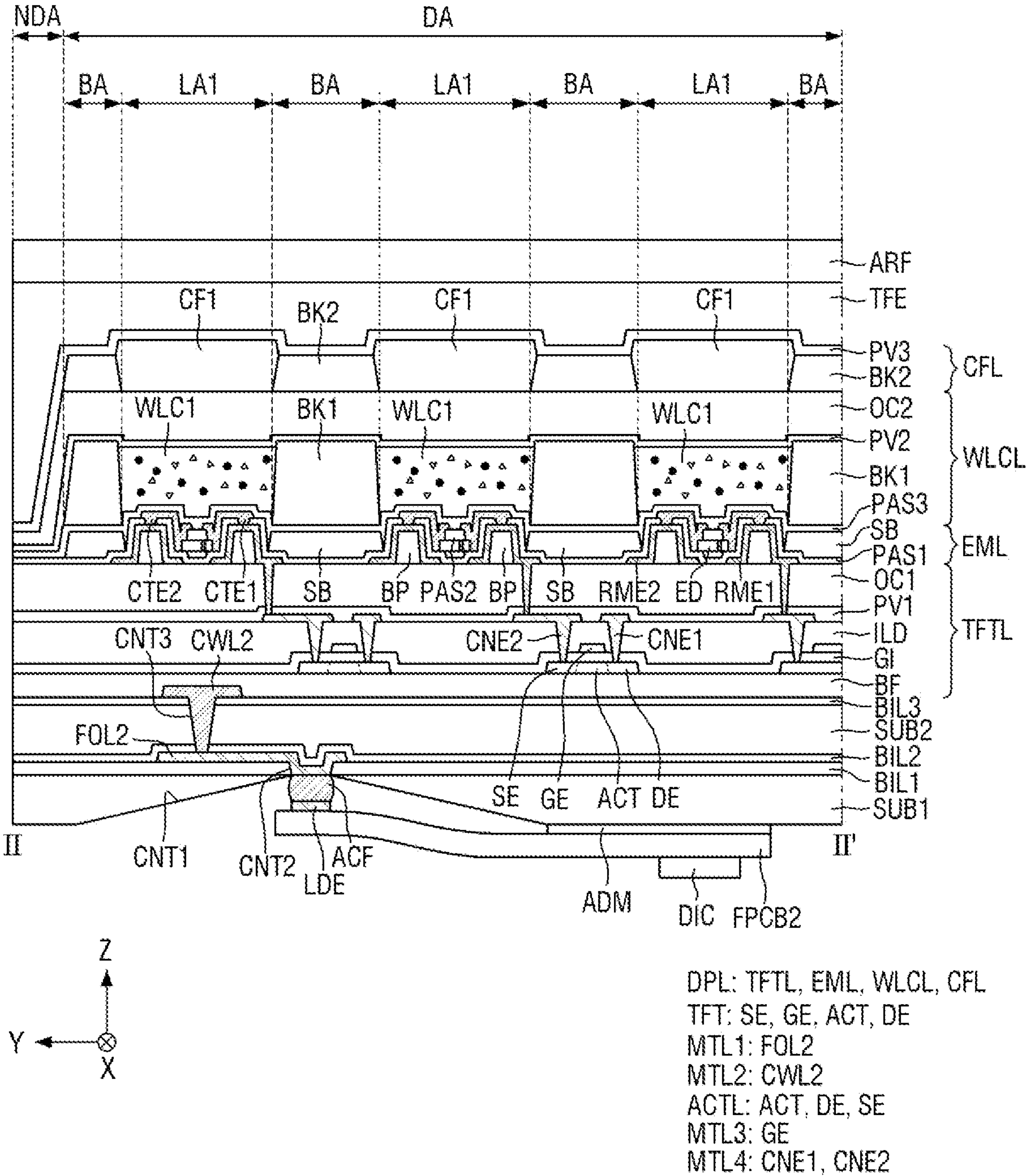
FIG. 3 is a schematic cross-sectional view taken along line II-II' of FIG. 1.
Figure 4:
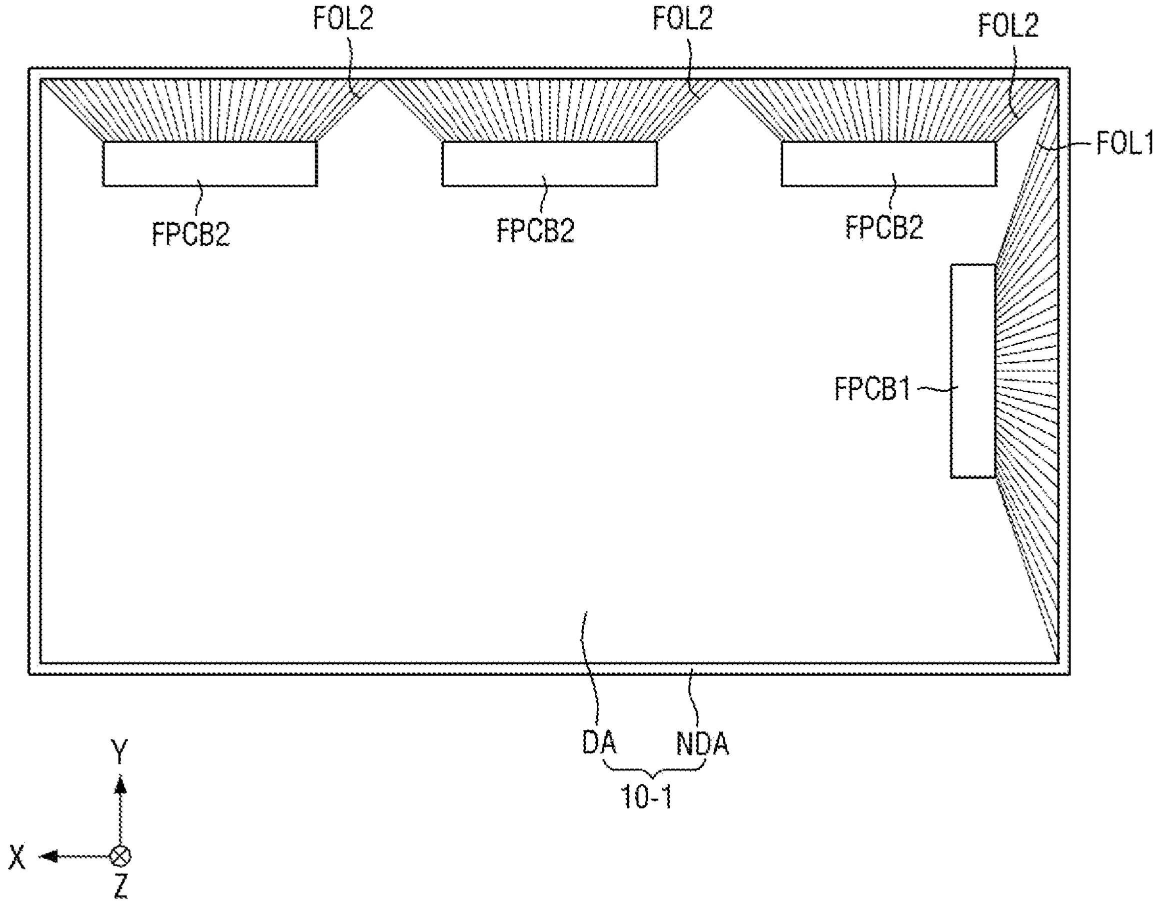
FIG. 4 is a bottom view showing a display device according to one embodiment.

FIG. 3 is a schematic cross-sectional view taken along line II-II' of FIG. 1, and FIG. 4 is a bottom view showing a display device according to one embodiment. Hereinafter, the same configurations as the above-described configurations will be briefly described, or a description thereof will be omitted.

Referring to FIGS. 3 and 4, the display device 10 may include the first substrate SUB1, the first barrier insulating layer BIL1, the first metal layer MTL1, the second barrier insulating layer BIL2, the second substrate SUB2, the third barrier insulating layer BIL3, the display layer DPL, the encapsulation layer TFE, the anti-reflection film ARF, a second flexible film FPCB2, and a data driver DIC.

The first substrate SUB1 may include the first contact hole CNT1. The first contact hole CNT1 may be etched from the bottom surface of the first substrate SUB1 to penetrate the top surface of the first substrate SUB1. For example, the lower width of the first contact hole CNT1 may be greater than the upper width of the first contact hole CNT1. In the manufacturing process of the display device 10, the bottom surface of a second fan-out line FOL2 inserted into the second contact hole CNT2 may be exposed by the first contact hole CNT1, and the second fan-out line FOL2 may be electrically connected to the lead electrode LDE of the second flexible film FPCB2 through the connection film ACF inserted into the first contact hole CNT1.

The first metal layer MTL1 may be disposed on the first barrier insulating layer BIL1. The first metal layer MTL1 may include the second fan-out line FOL2. For example, the first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The second fan-out line FOL2 may electrically connect the second flexible film FPCB2 to a second connection line CWL2. The second fan-out line FOL2 may be electrically connected to the second flexible film FPCB2 through the connection film ACF. The second fan-out line FOL2 may be electrically connected to a data line or a power line through the second connection line CWL2. The data line or the power line may be connected to the drain electrode of the thin film transistor TFT. Accordingly, the second fan-out line FOL2 may supply the data voltage or the power voltage received from the data driver DIC of the second flexible film FPCB2 to the thin film transistor TFT of the pixel through the second connection line CWL2. The display device 10 may include the second fan-out line FOL2 disposed in the display area DA, so that the area of the non-display area NDA may be minimized.

The display layer DPL may be disposed on the third barrier insulating layer BIL3. The display layer DPL may include a thin film transistor layer TFTL, a light emitting element layer EML, a wavelength conversion layer WLCL and a color filter layer CFL. The thin film transistor layer TFTL may include the second metal layer MTL2, the buffer layer BF, the active layer ACTL, the gate insulating layer GI, the third metal layer MTL3, the interlayer insulating layer ILD, the fourth metal layer MTL4, the first passivation layer PV1, and the first planarization layer OC1.

The second metal layer MTL2 may be disposed on the third barrier insulating layer BIL3. The second metal layer MTL2 may include the second connection line CWL2. For example, the second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The second connection line CWL2 may be inserted into the third contact hole CNT3 to be connected to the second fan-out line FOL2. For example, the second connection line CWL2 may be connected to the data line or the power line to supply the data voltage or the power voltage to the thin film transistor TFT. Accordingly, the second connection line CWL2 may supply the data voltage or the power voltage received from the data driver DIC through the second fan-out line FOL2 to the thin film transistor TFT of the pixel.

The second flexible film FPCB2 may be disposed under or below the first substrate SUB1. The second flexible film FPCB2 may be disposed on the other edge adjacent to one edge or an edge of the first substrate SUB1. The second flexible film FPCB2 may be attached to the bottom surface of the first substrate SUB1 using the adhesive member ADM. If necessary, the adhesive member ADM may be omitted. One edge or an edge of the second flexible film FPCB2 may be inserted into the first contact hole CNT1. The second flexible film FPCB2 may include the lead electrode LDE disposed on the top surface of one side or a side. The lead electrode LDE may be inserted into the first contact hole CNT1. The second flexible film FPCB2 may support the data driver DIC disposed on the bottom surface of the other side or another side. The lead electrode LDE may be electrically connected to the data driver DIC through a lead line (not shown) disposed on the bottom surface of the second flexible film FPCB2. The lead electrode LDE may be electrically connected to the second fan-out line FOL2 through the connection film ACF. The other side of the second flexible film FPCB2 may be connected to a source circuit board (not shown) under or below the first substrate SUB1. The second flexible film FPCB2 may transmit the data voltage or the power voltage of the data driver DIC to the display device 10.

The data driver DIC may be mounted on the second flexible film FPCB2. The data driver DIC may be an integrated circuit (IC). For example, the data driver DIC may convert digital video data into an analog data voltage based on the data control signal received from a timing controller (not shown), and supply the analog data voltage to the data line of the display area DA through the second flexible film FPCB2. For another example, the data driver DIC may supply the power voltage received from a power supply unit (not shown) to the power line of the display area DA through the second flexible film FPCB2. The display device 10 may include the second fan-out line FOL2 disposed on the first substrate SUB1 and the data driver DIC disposed under or below the first substrate SUB1, so that the area of the non-display area NDA may be minimized.

Figure 5:
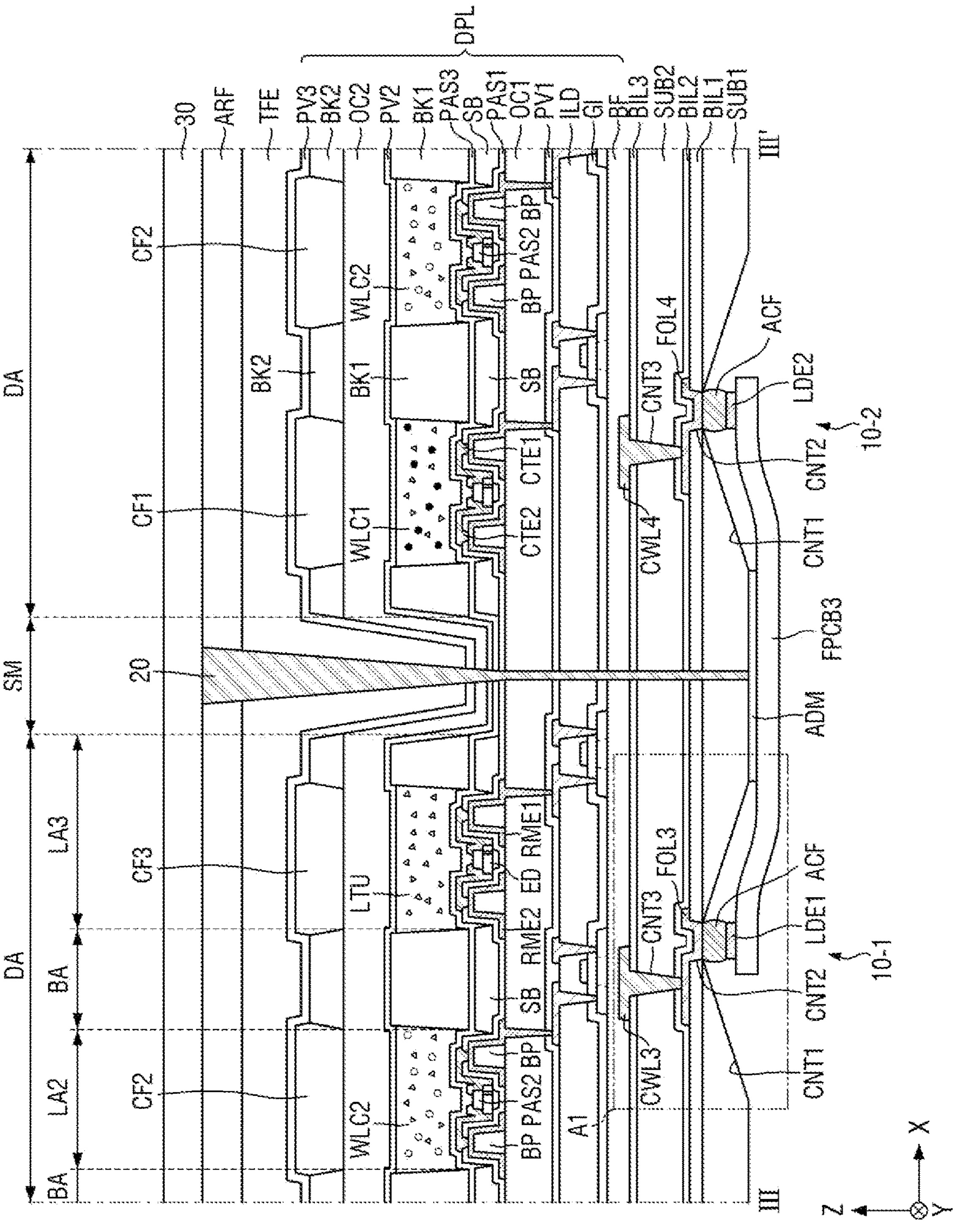
FIG. 5 is a schematic cross-sectional view taken along line III-III' of FIG. 1.

FIG. 5 is a schematic cross-sectional view taken along line III-III' of FIG. 1.

Referring to FIG. 5, the tiled display device TD may include display devices 10, a bonding part 20, and a cover part 30. The tiled display device TD may include first to fourth display devices 10-1 to 10-4. The number and connection relationship of the display devices 10 are not limited to the embodiment of FIG. 1. The number of the display devices 10 may be determined according to the size of each of the display devices 10 and the tiled display device TD.

The display device 10 may include a display area DA and a non-display area NDA. The display area DA may include pixels to display an image. The non-display area NDA may be disposed around the display area DA to surround or may be adjacent to the display area DA, and may not display an image.

The tiled display device TD may include a coupling area SM disposed between display areas DA. The tiled display device TD may be formed by connecting non-display areas NDA of the adjacent display devices 10. The display devices 10 may be connected to each other through the bonding part 20 or an adhesive member disposed in the coupling area SM. The coupling area SM of each of the display devices 10 may not include a pad member or a fan-out line connected to the pad member. Accordingly, the distance between the display areas DA of the display devices 10 may be small enough that the coupling area SM between the display devices 10 is not recognized by the user. The reflectance of external light of the display areas DA of the display devices 10 may be substantially the same as that of the coupling area SM between the display devices 10. Accordingly, in the tiled display device TD, the coupling area SM between the display devices 10 may be prevented from being recognized by the user, thereby reducing a sense of disconnection between the display devices 10 and improving a sense of immersion in an image.

The tiled display device TD may bond the side surfaces of the adjacent display devices 10 to each other by using the bonding part 20 disposed between the display devices 10. The bonding part 20 may connect the side surfaces of the first to fourth display devices 10-1 to 10-4 arranged or disposed in a grid form to implement the tiled display device TD. The coupling member 20 may couple or connect the side surfaces of the first substrates SUB1, the side surfaces of the first and second barrier insulating layers BIL1 and BIL2, the side surfaces of the second substrates SUB2, the side surfaces of the third barrier insulating layers BIL3, the side surfaces of the display layers DPL, the side surfaces of the encapsulation layers TFE, and the side surfaces of the anti-reflection films ARF of the display devices 10 adjacent to each other.

For example, the bonding part 20 may be made of an adhesive or a double-sided tape having a relatively thin thickness to minimize the gap between the display devices 10. For another example, the bonding part 20 may be formed of a bonding frame having a relatively thin thickness to minimize the gap between the display devices 10. Accordingly, in the tiled display device TD, it is possible to prevent the user from recognizing the coupling area SM between the display devices 10.

The cover part 30 may be disposed on the top surfaces of the display devices 10 and the bonding part 20 to cover or overlap the display devices 10 and the bonding part 20. For example, the cover part 30 may be disposed on the top surface of the anti-reflection film ARF of each of the display devices 10. The cover part 30 may protect the top surface of the tiled display device TD.

The first display device 10-1 may include a third connection line CWL3 and a third fan-out line FOL3.

The third connection line CWL3 may be disposed on the second metal layer MTL2. The third connection line CWL3 may be formed of a same material or a similar material in a same layer as the first and second connection lines CWL1 and CWL2, but the disclosure is not limited thereto. The third connection line CWL3 may be inserted into the third contact hole CNT3 to be connected to the third fan-out line FOL3. For example, the first connection line CWL1 illustrated in FIG. 2 may be connected to one end or an end of the gate line, and the third connection line CWL3 may be connected to the other end or another end of the gate line. The third connection line CWL3 may supply a gate signal to the third fan-out line FOL3, and the third fan-out line FOL3 may be electrically connected to a fourth fan-out line FOL4 of the second display device 10-2 through a third flexible film FPCB3.

The third fan-out line FOL3 may be disposed on the first metal layer MTL1. The third fan-out line FOL3 may be formed of a same material or a similar material in a same layer as the first and second fan-out lines FOL1 and FOL2, but the disclosure is not limited thereto. The third fan-out line FOL3 may electrically connect the third connection line CWL3 to the third flexible film FPCB3. The third fan-out line FOL3 may be electrically connected to a first lead electrode LDE1 disposed at one end or an end of the third flexible film FPCB3 through the connection film ACF. The third fan-out line FOL3 may receive the gate signal from the gate line of the first display device 10-1 through the third connection line CWL3, and may supply the gate signal to the fourth fan-out line FOL4 of the second display device 10-2.

The tiled display device TD may further include the third flexible film FPCB3 that electrically connects the adjacent display devices 10.

The third flexible film FPCB3 may be disposed under or below the first substrate SUB1. One edge or an edge of the third flexible film FPCB3 may be inserted into the first contact hole CNT1 of the first display device 10-1, and the other edge or another edge of the third flexible film FPCB3 may be inserted into the first contact hole CNT1 of the second display device 10-2. The third flexible film FPCB3 may include the first lead electrode LDE1 disposed on the top surface of one side or a side and a second lead electrode LDE2 disposed on the top surface of the other side or another side. The first lead electrode LDE1 may be inserted into the first contact hole CNT1 of the first display device 10-1, and may be electrically connected to the third fan-out line FOL3 through the connection film ACF. The second lead electrode LDE2 may be inserted into the first contact hole CNT1 of the second display device 10-2, and may be electrically connected to the fourth fan-out line FOL4 through the connection film ACF. Accordingly, the third flexible film FPCB3 may transmit the gate signal supplied to the first display device 10-1 by the gate driver GIC to the second display device 10-2.

The third flexible film FPCB3 may be disposed in the display area DA of the first display device 10-1, the coupling area SM, and the display area DA of the second display device 10-2 under or below the first substrate SUB1. At least a part of the third flexible film FPCB3 may be attached to the bottom surface of the first substrate SUB1 in the coupling area SM using the adhesive member ADM.

The second display device 10-2 may include the fourth fan-out line FOL4 and a fourth connection line CWL4. The fourth fan-out line FOL4 may be disposed on the first metal layer MTL1, and the fourth connection line CWL4 may be disposed on the second metal layer MTL2. The fourth fan-out line FOL4 may electrically connect the third flexible film FPCB3 to the fourth connection line CWL4. The fourth fan-out line FOL4 may be electrically connected to the second lead electrode LDE2 disposed at the other end of the third flexible film FPCB3 through the connection film ACF. The fourth fan-out line FOL4 may supply the gate signal received from the third flexible film FPCB3 to the gate line of the second display device 10-2 through the fourth connection line CWL4.

The tiled display device TD may supply the gate signal received from the gate driver GIC connected to the first display device 10-1 to the second display device 10-2 through the third flexible film FPCB3. The second display device 10-2 may not be directly connected to the gate driver GIC, and may receive a gate signal from the adjacent first display device 10-1. Accordingly, in case that the tiled display device TD may include the display devices 10, some or a number of the display devices 10 may not be directly connected to the gate driver GIC and may receive a gate signal from some or a number of other display devices 10 directly connected to the gate driver GIC.

Referring to FIG. 5 in conjunction with FIGS. 1 and 3, the tiled display device TD may supply the data voltage or the power voltage received from the data driver DIC connected to the first display device 10-1 to the third display device 10-3 through the third flexible film FPCB3. The third display device 10-3 may not be directly connected to the data driver DIC, and may receive the data voltage or the power voltage from the adjacent first display device 10-1. Accordingly, in case that the tiled display device TD may include the display devices 10, some or a number of the display devices 10 may not be directly connected to the data driver DIC and may receive a data voltage or a power voltage from some or a number of other display devices 10 directly connected to the data driver DIC.

In the tiled display device TD, the gate driver GIC and the data driver DIC are connected to some or a number of the display devices 10, and an electrical signal is transmitted to some or a number of other display devices 10 through the third flexible film FPCB3, so that the size of the coupling area SM may be minimized. Accordingly, the size of the coupling area SM may be small enough that the coupling area SM is not recognized by the user, and the tiled display device TD may prevent the coupling area SM from being recognized by the user, thereby reducing a sense of disconnection between the display devices 10 and improving a sense of immersion in an image.

Figure 6:
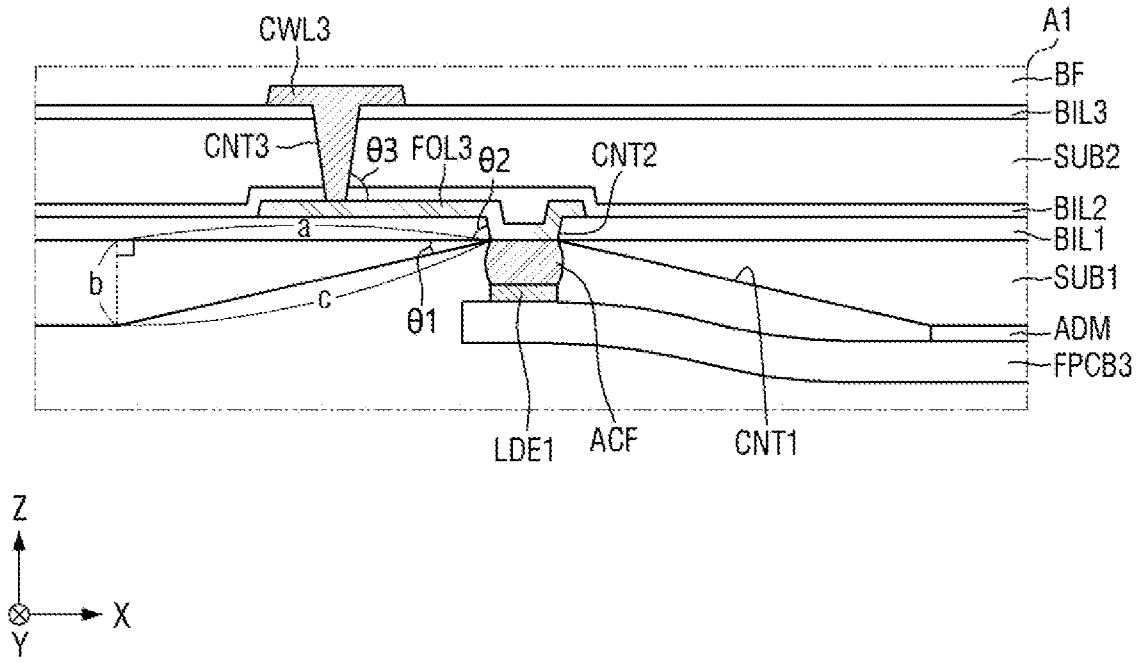
FIG. 6 is an enlarged view of area A1 of FIG. 5.

FIG. 6 is an enlarged view of area A1 of FIG. 5.

Referring to FIG. 6, the first substrate SUB1 may include the first contact hole CNT1. The first contact hole CNT1 may be etched from the bottom surface of the first substrate SUB1 to penetrate the top surface of the first substrate SUB1. For example, the lower width of the first contact hole CNT1 may be greater than the upper width of the first contact hole CNT1. In the manufacturing process of the display device 10, the bottom surface of the first fan-out line FOL1 inserted into the second contact hole CNT2 may be exposed by the first contact hole CNT1, and the first fan-out line FOL1 may be electrically connected to the lead electrode LDE of the first flexible film FPCB1 through the connection film ACF inserted into the first contact hole CNT1.

The first contact hole CNT1 may be formed by at least two etching processes having different etching rates. A part of the first substrate SUB1 may be etched by a first etching process. For example, the first etching process may be an atmospheric pressure (AP) plasma process using an etching gas containing fluorine (F) radicals, but is not limited thereto. The etching gas may include at least one of nitrogen trifluoride ($NF_3$), carbon tetrafluoride ($CF_4$), fluoromethane ($CH_3F$), or difluoromethane ($CH_2F_2$), but the disclosure is not limited thereto. In the first etching process, the proportion of the fluorine (F) radicals of the etching gas may be about 5% or more of the total gas. In case that the proportion of the etching gas containing the fluorine (F) radicals is about 5% or more of the total gas, a part of the first substrate SUB1 may be etched without damaging the first metal layer MTL1 due to the difference in etching rate between the first substrate SUB1 and the first metal layer MTL1. For another example, the first etching process may be a laser etching process. In the first etching process, a part of the first substrate SUB1 may be etched by adjusting the intensity of laser. Accordingly, one surface or a surface of the first substrate SUB1 may be etched by the first etching process, and a residual layer protecting the third fan-out line FOL3 may remain. The thickness of the residual layer of the first substrate SUB1 may be about 30% or less of the thickness of the first substrate SUB1, but is not limited thereto. A thickness T2 of the residual layer of the first substrate SUB1 may be in a range of about 1 μm to about 3 μm, but is not limited thereto. The thickness of the residual layer of the first substrate SUB1 may be set based on the etching rate of a second etching process and the possibility of damage to the first metal layer MTL1.

The residual layer of the first substrate SUB1 may be etched by the second etching process. For example, the second etching process may be an atmospheric pressure (AP plasma) process using an etching gas that does not contain fluorine (F) radicals, but is not limited thereto. In the second etching process, the etching gas that does not contain fluorine (F) radicals is used, so that the bottom surface of the first metal layer MTL1 exposed by the first contact hole CNT1 may not be damaged. The etching rate of the second etching process may be about ⅙ or less of the etching rate of the first etching process, but the disclosure is not limited thereto. Since the second etching process uses only clean dry air (CDA) without containing fluorine (F) radicals, the flow rate of the etching gas may be about 15 slm or more. In the second etching process, the etching rate may be controlled by adjusting the flow rate of the etching gas. In case that the second etching process is completed, the first contact hole CNT1 may be formed, and the undamaged bottom surface of the first metal layer MTL1 may be exposed. The third fan-out line FOL3 may be electrically connected to the third flexible film FPCB3 through the connection film ACF.

A first angle θ1, which is the etching angle of the first contact hole CNT1 between a top surface 'a' of the first substrate SUB1 and an inner surface 'c' of the first contact hole CNT1, may be about 10 degrees or less. A tangent value (tan θ1=b/a) of the first angle θ1 may be smaller or less than a tangent value (tan(0.17444 rad) of about 10 degrees. The first angle θ1 formed by two etching processes may be smaller or less than a second angle θ2 that is the etching angle of the second contact hole CNT2 between the top surface of the first substrate SUB1 and the inner surface of the second contact hole CNT2 and a third angle θ3 that is the etching angle of the third contact hole CNT3 between the third fan-out line FOL3 and the inner surface of the third contact hole CNT3. The first contact hole CNT1 is formed by the first etching process having a relatively high etching rate and the second etching process having a relatively low etching rate, so that the contact between the connection film ACF and the third fan-out line FOL3 may be facilitated without damaging the third fan-out line FOL3, thereby ensuring reliability.

FIGS. 7 to 14 are schematic cross-sectional views illustrating a process of manufacturing the display device according to one embodiment.

Figure 7:
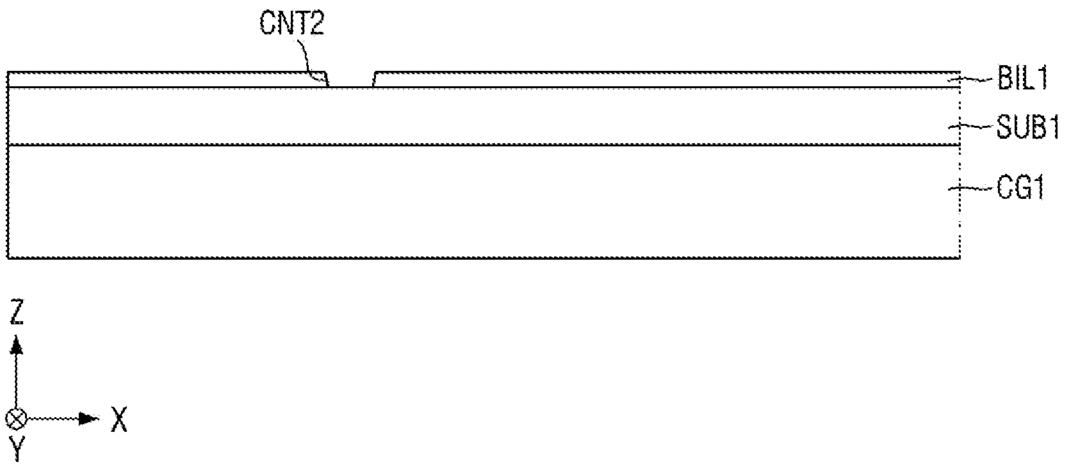
FIGS. 7 to 14 are schematic cross-sectional views illustrating a process of manufacturing the display device according to one embodiment.

In FIG. 7, a first carrier substrate CG1 may support the display device 10 in the manufacturing process of the display device 10. For example, the first carrier substrate CG1 may be a carrier glass, but is not limited thereto.

The first substrate SUB1 may be disposed on the first carrier substrate CG1. The first substrate SUB1 may be a base substrate or a base member. For example, the first substrate SUB1 may include an insulating material such as a polymer resin such as polyimide (PI), but the disclosure is not limited thereto.

The first barrier insulating layer BIL1 may be disposed on the first substrate SUB1. The first barrier insulating layer BIL1 may include an inorganic layer that prevents permeation of air or moisture. For example, the first barrier insulating layer BIL1 may be patterned on the first substrate SUB1 by a photo process, a wet etching process, and a strip process, but the disclosure is not limited thereto. The first barrier insulating layer BIL1 may include the second contact hole CNT2. The second contact hole CNT2 may be etched from the top surface of the first barrier insulating layer BIL1 to penetrate the bottom surface of the first barrier insulating layer BIL1.

Figure 8:
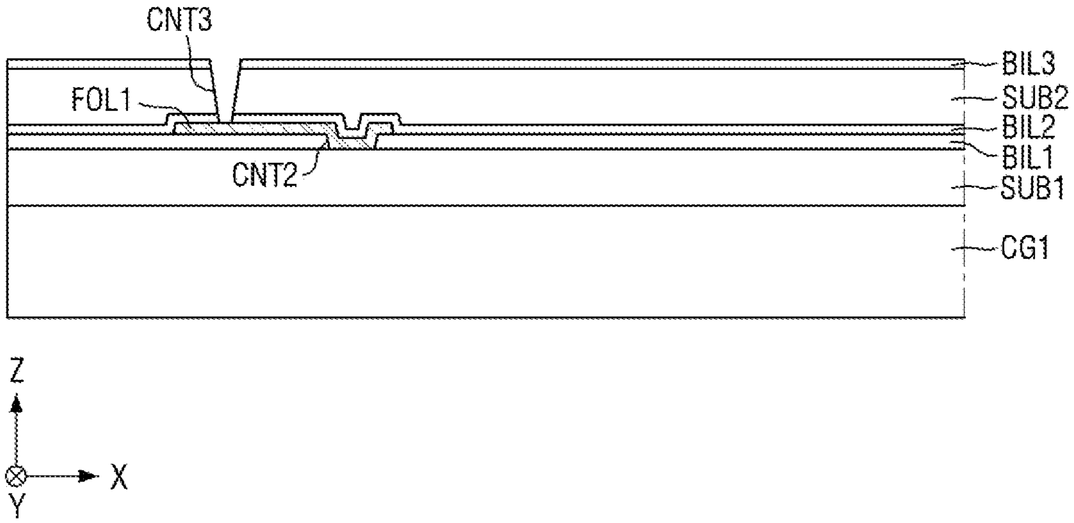

In FIG. 8, the first fan-out line FOL1 may be disposed on the first barrier insulating layer BIL1, and may be inserted into the second contact hole CNT2. For example, the first fan-out line FOL1 may be patterned on the first barrier insulating layer BIL1 by a photo process, a wet etching process, and a strip process, but the disclosure is not limited thereto.

The second barrier insulating layer BIL2 may be disposed on the first barrier insulating layer BIL1 and the first fan-out line FOL1. The second substrate SUB2 and the third barrier insulating layer BIL3 may be sequentially stacked each other on the second barrier insulating layer BIL2. The third contact hole CNT3 may be etched from the top surface of the third barrier insulating layer BIL3 to penetrate the bottom surface of the second barrier insulating layer BIL2. For example, the second and third barrier insulating layers BIL2 and BIL3 and the second substrate SUB2 may be penetrated by a dry etching process or a wet etching process, but the disclosure is not limited thereto. The top surface of the first fan-out line FOL1 may be exposed by the third contact hole CNT3.

Figure 9:
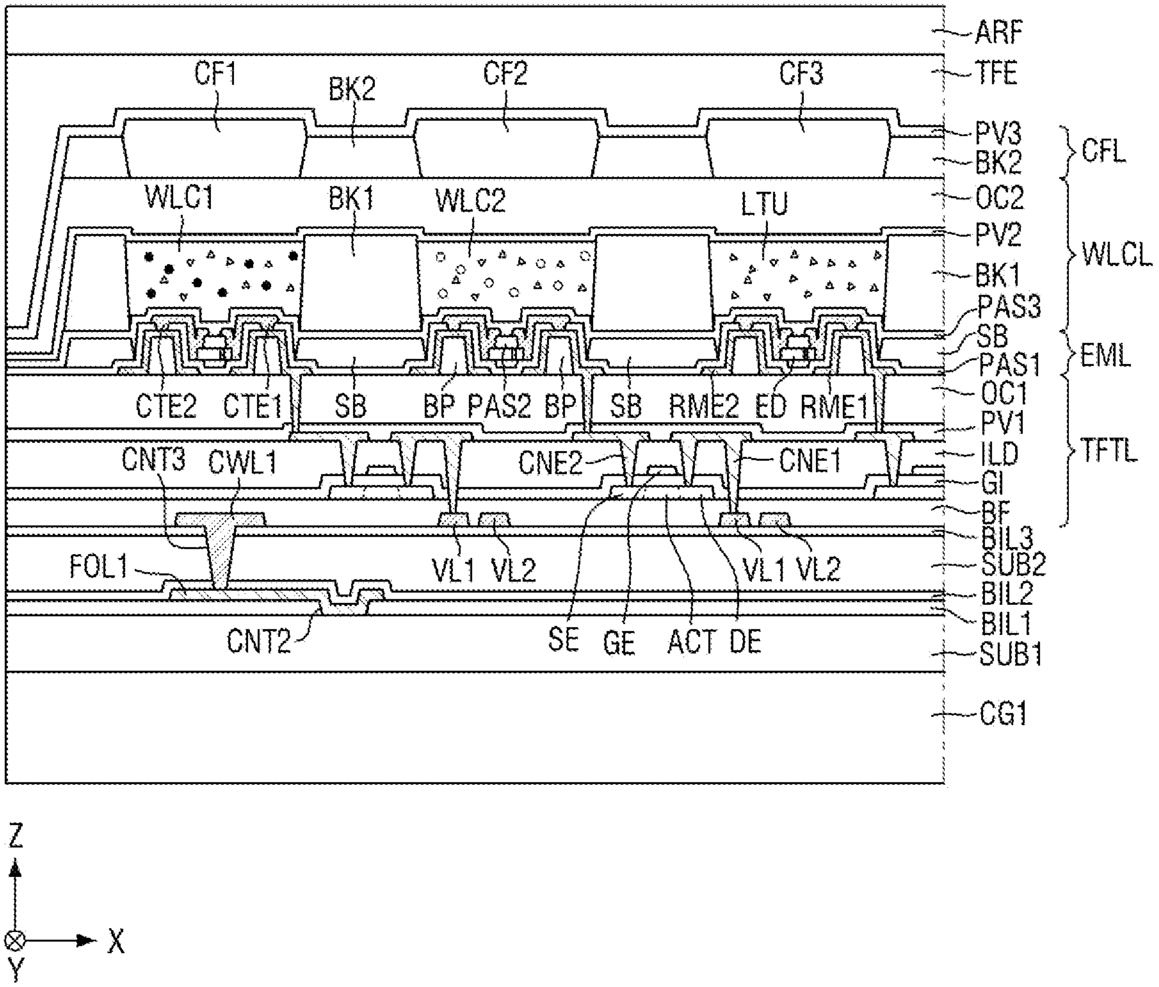

In FIG. 9, the display layer DPL may be stacked on the third barrier insulating layer BIL3. The thin film transistor layer TFTL, the light emitting element layer EML, the wavelength conversion layer WLCL, and the color filter layer CFL may be sequentially stacked each other on the third barrier insulating layer BIL3. The encapsulation layer TFE may cover or overlap the top and side surfaces of the display layer DPL. The anti-reflection film ARF may be formed on the encapsulation layer TFE.

Figure 10:
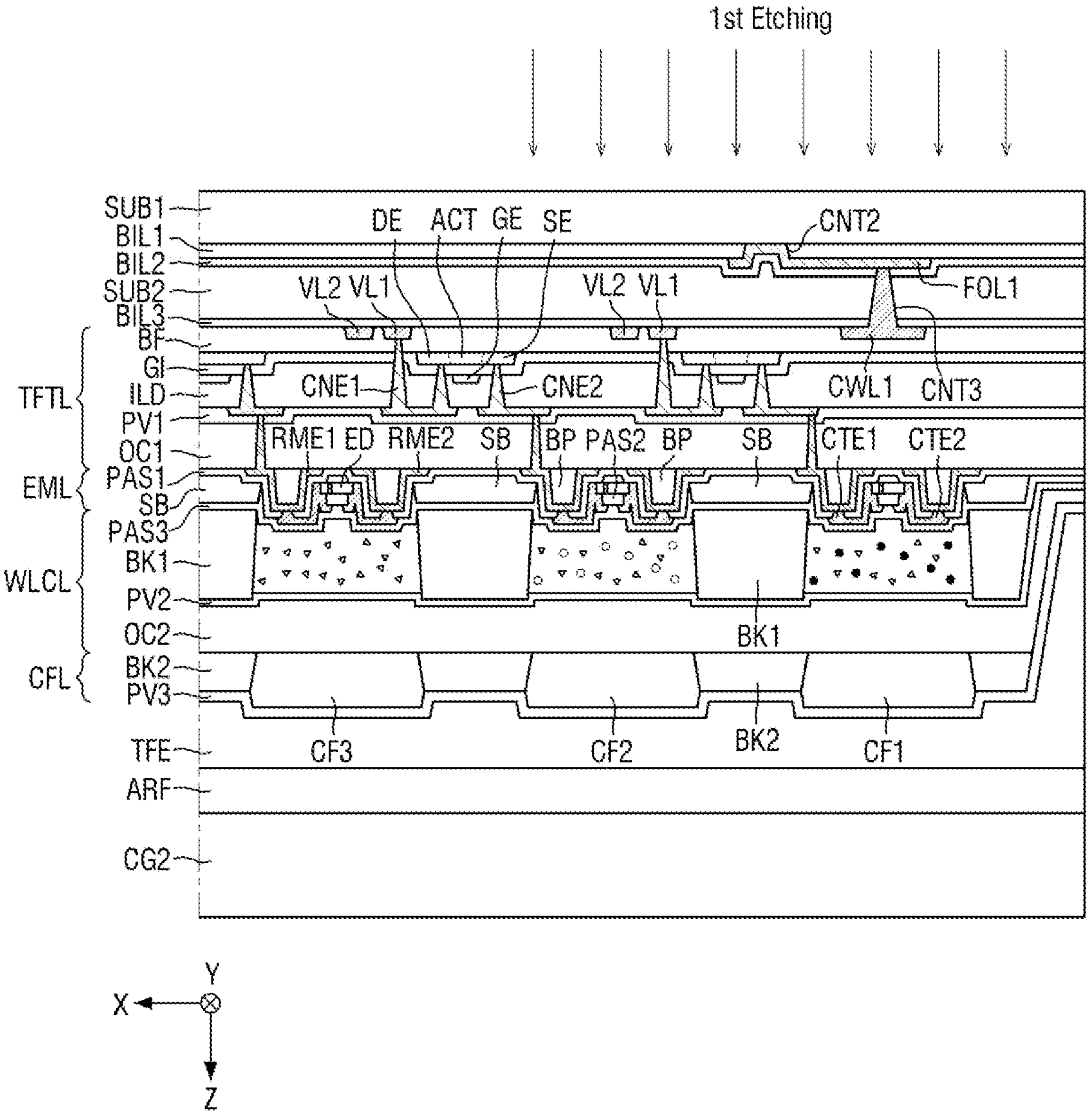

In FIG. 10, the display device 10 that is being manufactured may be vertically inverted to form the first flexible film FPCB1. The first carrier substrate CG1 may be removed from the first substrate SUB1. For example, the first carrier substrate CG1 may be removed from the bottom surface of the first substrate SUB1 using a sacrificial layer (not shown) disposed between the first carrier substrate CG1 and the first substrate SUB1, but the disclosure is not limited thereto.

A second carrier substrate CG2 may be disposed on one surface or a surface of the anti-reflection film ARF. The second carrier substrate CG2 may support the vertically inverted display device 10. For example, the second carrier substrate CG2 may be a carrier glass, but is not limited thereto.

A part of the first substrate SUB1 may be etched by the first etching process ($1^{st}$ etching). For example, the first etching process (1st etching) may be an atmospheric pressure (AP) plasma process using an etching gas containing fluorine (F) radicals, but is not limited thereto. The etching gas may include at least one of nitrogen trifluoride ($NF_3$), carbon tetrafluoride ($CF_4$), fluoromethane ($CH_3F$), or difluoromethane ($CH_2F_2$), but the disclosure is not limited thereto. In the first etching process ($1^{st}$ etching), the proportion of the fluorine (F) radicals of the etching gas may be about 5% or more of the total gas. In case that the proportion of the etching gas containing the fluorine (F) radicals is about 5% or more of the total gas, a part of the first substrate SUB1 may be etched without damaging the first metal layer MTL1 due to the difference in etching rate between the first substrate SUB1 and the first metal layer MTL1. For another example, the first etching process ($1^{st}$ etching) may be a laser etching process. In the first etching process ($1^{st}$ etching), a part of the first substrate SUB1 may be etched by adjusting the intensity of the laser. Accordingly, one surface or a surface of the first substrate SUB1 may be etched by the first etching process ($1^{st}$ etching), and a residual layer protecting the third fan-out line FOL3 may remain.

Figure 11:
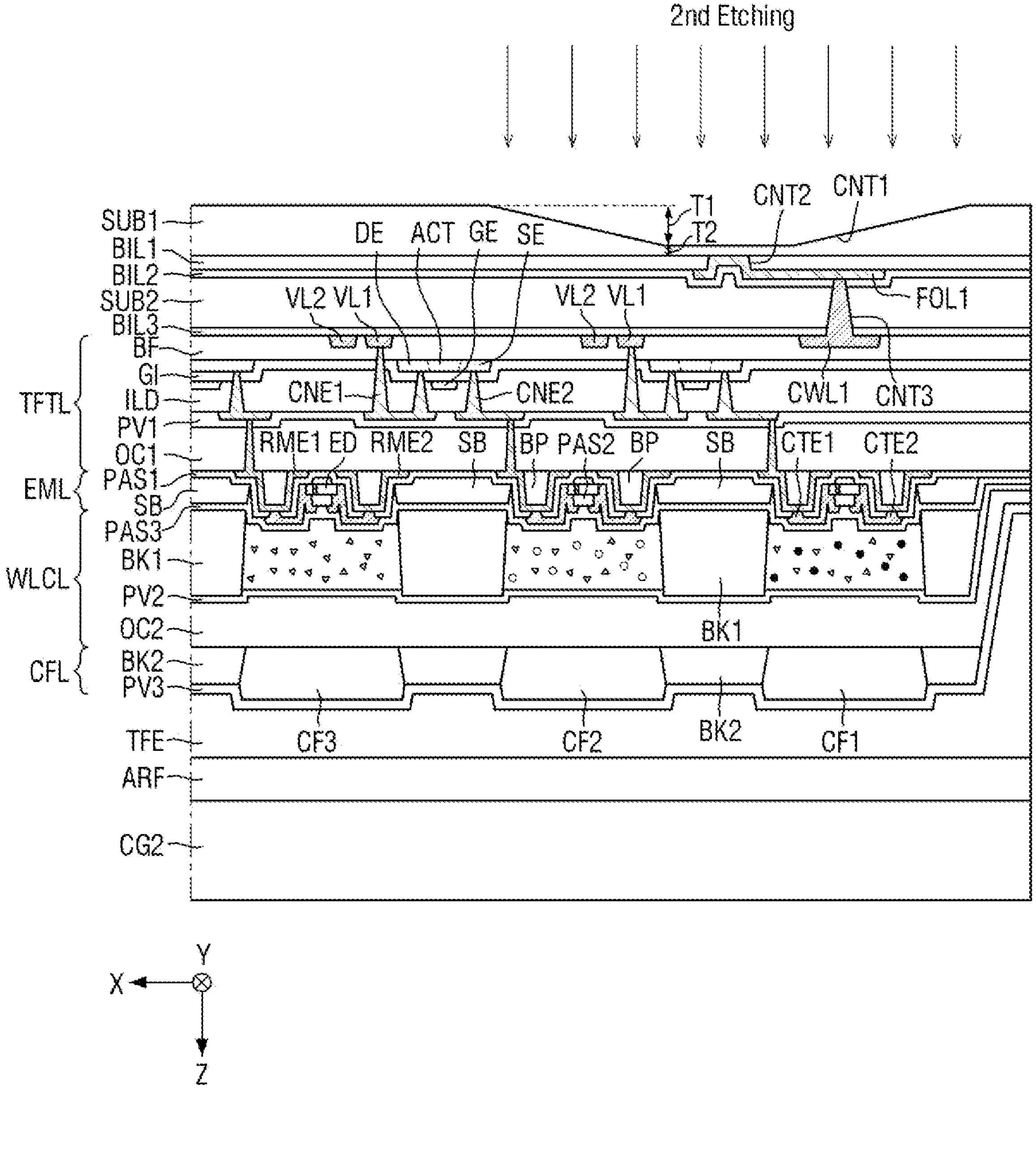

In FIG. 11, the thickness T2 of the residual layer of the first substrate SUB1 may be about 30% or less of the thickness T1+T2 of the first substrate SUB1, but is not limited thereto. The thickness T2 of the residual layer of the first substrate SUB1 may be 3/7 or less of the etched thickness T1. The thickness T2 of the residual layer of the first substrate SUB1 may be set based on the etching rate of the second etching process ($2^{nd}$ etching) and the possibility of damage to the first metal layer MTL1. The thickness T2 of the residual layer of the first substrate SUB1 may be in a range of about 1 μm to about 3 μm, but is not limited thereto.

The residual layer of the first substrate SUB1 may be etched by the second etching process ($2^{nd}$ etching). For example, the second etching process ($2^{nd}$ etching) may be an atmospheric pressure (AP) plasma process using an etching gas that does not contain fluorine (F) radicals, but is not limited thereto. In the second etching process ($2^{nd}$ etching), the etching gas that does not contain fluorine (F) radicals is used, so that the bottom surface of the first metal layer MTL1 exposed by the first contact hole CNT1 may not be damaged. The etching rate of the second etching process ($2^{nd}$ etching) may be about ⅙ or less of the etching rate of the first etching process ($1^{st}$ etching), but is not limited thereto. Since the second etching process uses only clean dry air (CDA) without containing fluorine (F) radicals, the flow rate of the etching gas may be about 15 slm or more. In the second etching process, the etching rate may be controlled by adjusting the flow rate of the etching gas.

Figure 12:
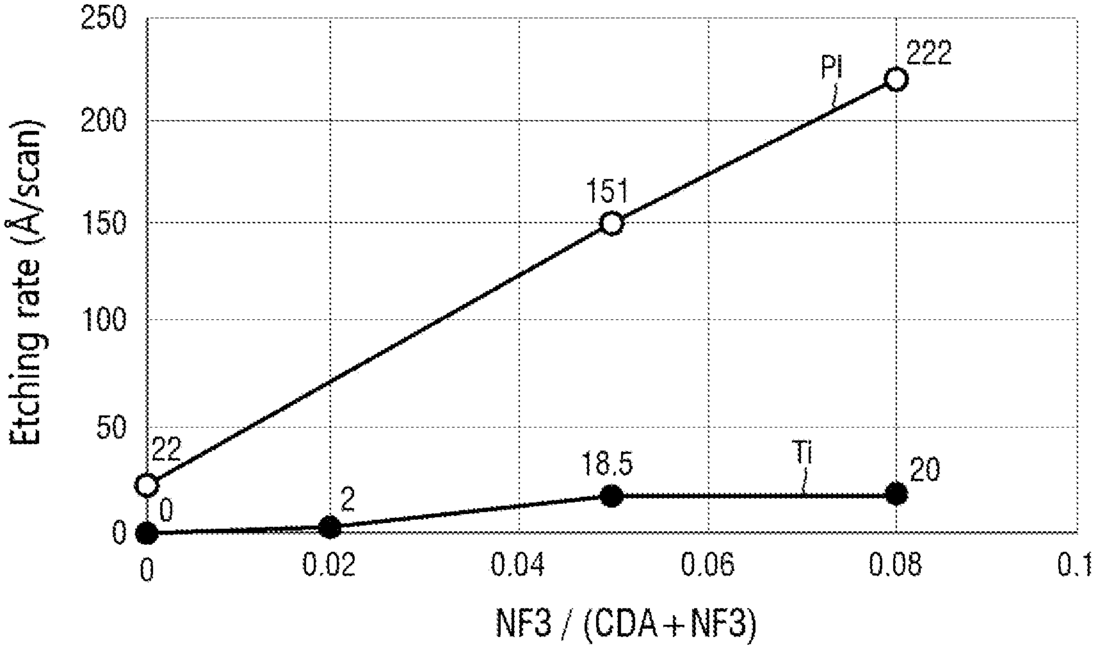

In FIG. 12, the first etching process ($1^{st}$ etching) may be an atmospheric pressure (AP) plasma process using an etching gas containing fluorine (F) radicals. In the first etching process ($1^{st}$ etching), the proportion of fluorine (F) radicals of the etching gas may be about 5% or more of the total gas. The first etching process (1st etching) may use the etching selectivities of the first substrate SUB1 and the first fan-out line FOL1. For example, the etching rate of the first substrate SUB1 may be set to be higher than the etching rate of the first fan-out line FOL1. The etching selectivity may be determined by at least one process condition, for example, an etching gas, a temperature, a pressure, or a plasma power, used in the etching process.

For example, in case that the first etching process (1st etching) uses an etching gas in which the proportion of nitrogen trifluoride ($NF_3$) is about 5% of the total gas ($NF_3$+CDA), the etching rate of polyimide (PI) may be 151, and the etching rate of titanium (Ti) may be 18.5. The first substrate SUB1 may contain polyimide (PI), and the first fan-out line FOL1 may contain titanium (Ti). Accordingly, in the first etching process ($1^{st}$ etching), the damage to the bottom surface of the first fan-out line FOL1 may be prevented by the residual layer of the first substrate SUB1.

For another example, in case that the first etching process ($1^{st}$ etching) uses an etching gas in which the proportion of nitrogen trifluoride ($NF_3$) is about 8% of the total gas ($NF_3$+CDA), the etching rate of polyimide (PI) may be 222, and the etching rate of titanium (Ti) may be 20. Accordingly, in the first etching process ($1^{st}$ etching), the damage to the bottom surface of the first fan-out line FOL1 may be prevented by the residual layer of the first substrate SUB1.

The second etching process ($2^{nd}$ etching) may use the etching selectivities of the first substrate SUB1 and the first fan-out line FOL1. For example, the etching rate of the first substrate SUB1 may be set to be higher than the etching rate of the first fan-out line FOL1.

The second etching process ($2^{nd}$ etching) may be an atmospheric pressure (AP) plasma process using an etching gas that does not contain fluorine (F) radicals. The second etching process ($2^{nd}$ etching) may be performed using only clean dry air (CDA). In case that the second etching process ($2^{nd}$ etching) uses an etching gas in which the proportion of nitrogen trifluoride ($NF_3$) is about 0% of the total gas ($NF_3$+CDA), the etching rate of polyimide (PI) may be 22, and the etching rate of titanium (Ti) may be zero. Accordingly, in the second etching process ($2^{nd}$ etching), the residual layer of the first substrate SUB1 may be etched without damaging the first fan-out line FOL1.

A first angle θ1, which is the etching angle of the first contact hole CNT1 between a top surface 'a' of the first substrate SUB1 and an inner surface 'c' of the first contact hole CNT1, may be about 10 degrees or less. A tangent value (tan θ1=b/a) of the first angle θ1 may be smaller or less than a tangent value (tan(0.17444 rad) of about 10 degrees. The first angle θ1 formed by two etching processes may be smaller or less than a second angle θ2 that is the etching angle of the second contact hole CNT2 between the top surface of the first substrate SUB1 and the inner surface of the second contact hole CNT2 and a third angle θ3 that is the etching angle of the third contact hole CNT3 between the third fan-out line FOL3 and the inner surface of the third contact hole CNT3. The second angle θ2 and the third angle θ3 may be about 30 degrees or more, but are not limited thereto. Accordingly, the first contact hole CNT1 is formed by the first etching process ($1^{st}$ etching) having a relatively high etching rate and the second etching process ($2^{nd}$ etching) having a relatively low etching rate, so that it is possible to facilitate the contact between the connection film ACF and the first fan-out line FOL1 without damaging the first fan-out line FOL1, thereby ensuring reliability.

Figure 13:
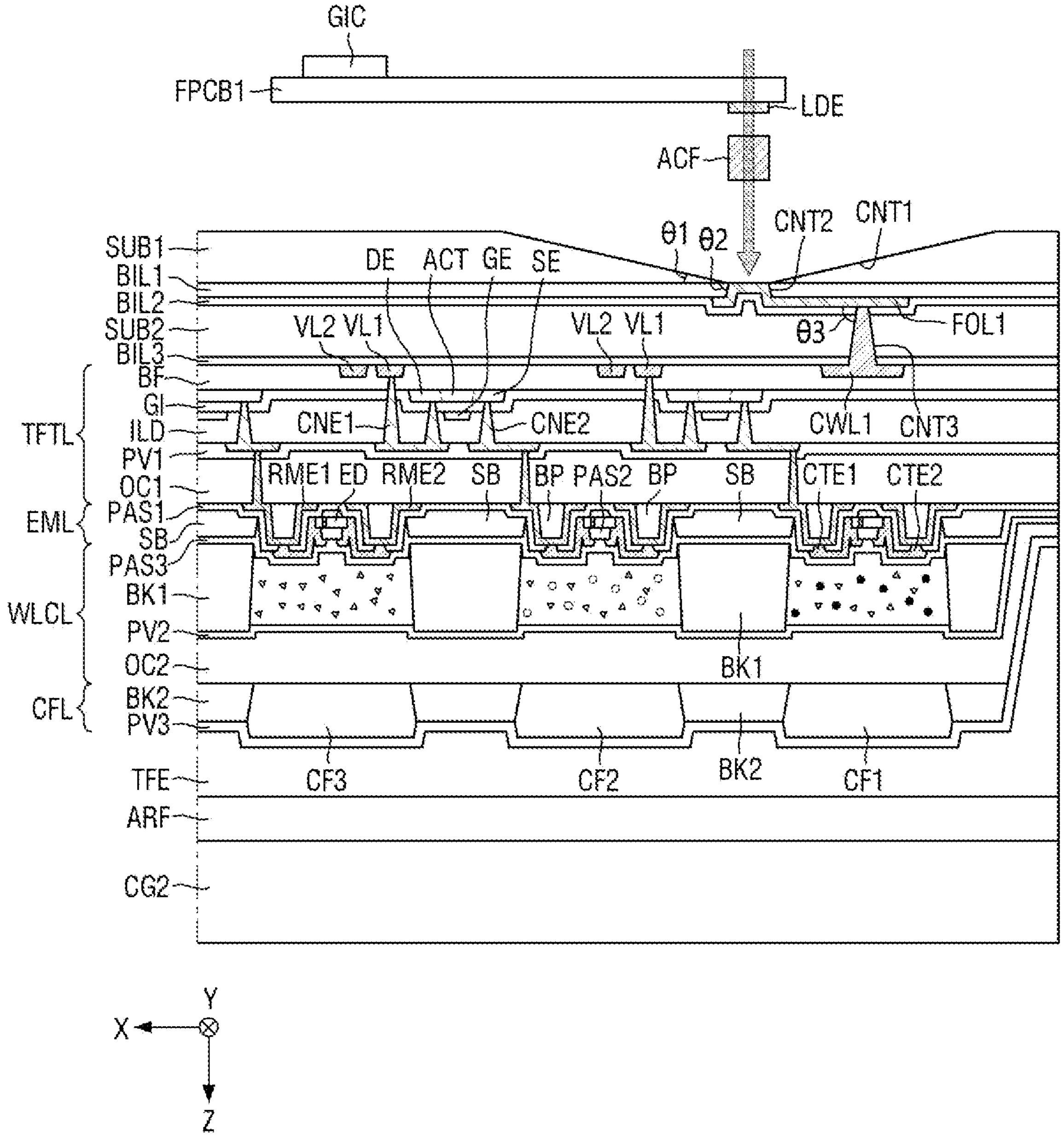
Figure 14:
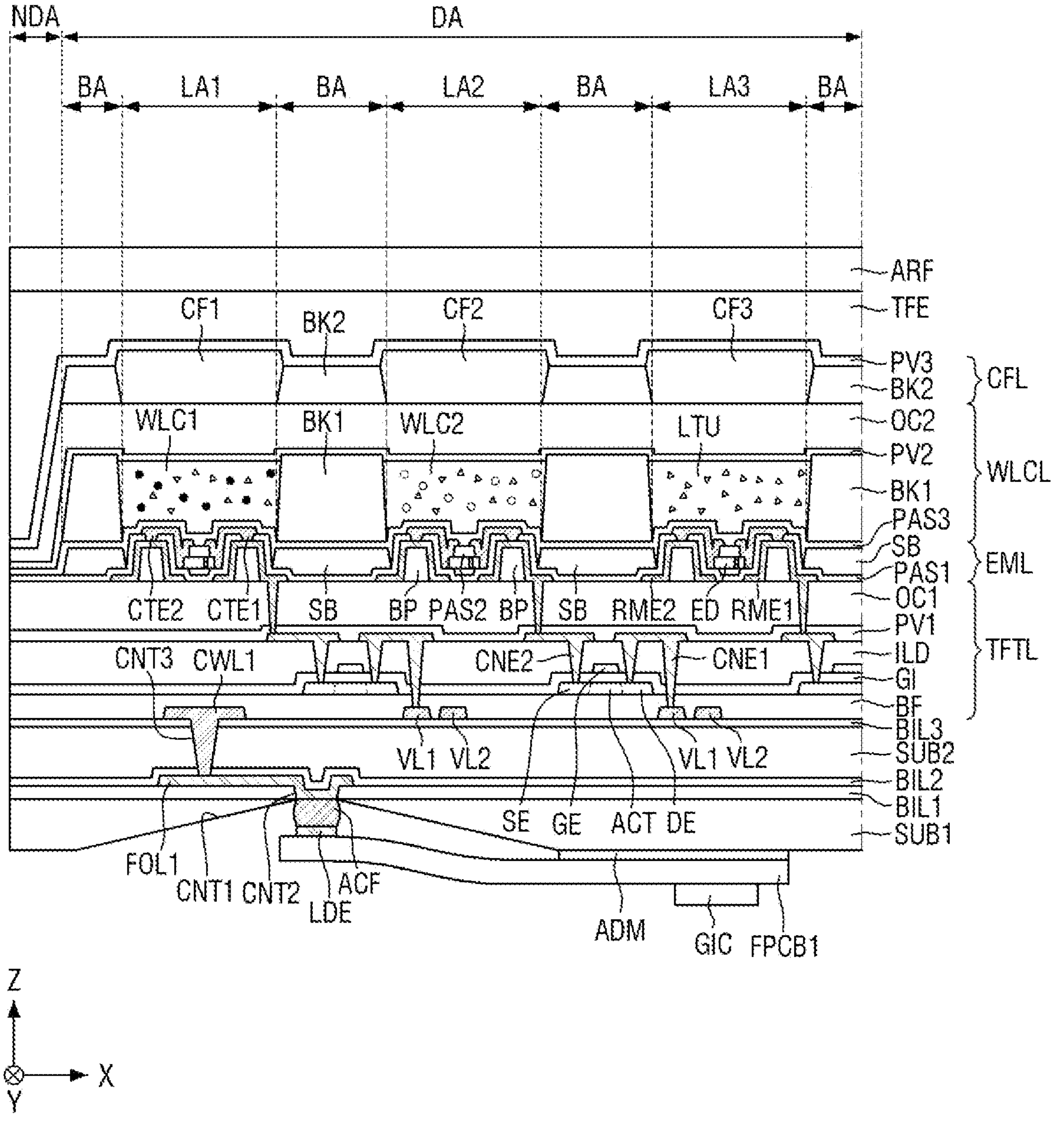

In FIGS. 13 and 14, the first flexible film FPCB1 may be disposed on one surface or a surface of the first substrate SUB1. The first flexible film FPCB1 and the connection film ACF may be aligned on the first fan-out line FOL1 exposed through the first contact hole CNT1 by an alignment process. The lead electrode LDE of the first flexible film FPCB1 may be electrically connected to the first fan-out line FOL1 through the connection film ACF.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure and as set forth in the following claims.

What is claimed is:

1. A display device comprising:

a first substrate comprising a first contact hole;

an insulating layer on a top surface of the first substrate, the insulating layer having a second contact hole connected to the first contact hole;

fan-out lines disposed in a first metal layer on the insulating layer, wherein the second contact hole receives a bottom surface of a fan-out line among the fan-out lines;

a second substrate disposed on the first metal layer and comprising a third contact hole;

connection lines disposed in a second metal layer on the second substrate, the connection lines electrically connected to the fan-out lines through the third contact hole, respectively;

a thin film transistor disposed in an active layer and a third metal layer disposed on the second metal layer; and at least one flexible film disposed on a bottom surface of the first substrate, the at least one flexible film electrically connected to the fan-out lines through the first contact hole, wherein a first angle between the top surface of the first substrate and an inner surface of the first contact hole is less than a third angle between the fan-out line and an inner surface of the third contact hole, and wherein a second angle between the top surface of the first substrate and an inner surface of the second contact hole is less than the third angle.

2. The display device of claim 1, wherein the first angle is about 10 degrees or less, and the third angle is about 30 degrees or more.

3. The display device of claim 1, further comprising:

a gate driver disposed on a first flexible film disposed on an edge of the first substrate, wherein the first flexible film supplies a gate signal received from the gate driver to a first connection line among the connection lines through a first fan-out line among the fan-out lines.

4. The display device of claim 3, wherein the first connection line is electrically connected to a gate electrode of the thin film transistor disposed in the third metal layer.

5. The display device of claim 3, wherein the at least one flexible film comprises flexible films, the display device includes a data driver disposed on a second flexible film disposed on another edge adjacent to an edge of the first substrate among the flexible films, and the second flexible film supplies a data voltage or a power voltage received from the data driver to a second connection line among the connection lines through a second fan-out line among the fan-out lines.

6. The display device of claim 5, wherein the second connection line is electrically connected to a drain electrode of the thin film transistor disposed in the active layer.

7. The display device of claim 1, further comprising:

a voltage line disposed in the second metal layer; and a connection electrode disposed in a fourth metal layer on the third metal layer, wherein an end of the connection electrode is electrically connected to the voltage line, and another end of the connection electrode is electrically connected to the thin film transistor.

8. A tiled display device comprising:

a first display device and a second display device, the first display device and the second display device being adjacent to each other, the first display device and the second display device each comprising a display area having pixels and a non-display area adjacent to the display area; and a bonding part that bonds the first display device to the second display device, wherein the first display device and the second display device each comprise:

a first substrate comprising a first contact hole;

a fan-out line disposed in a first metal layer on the first substrate;

a second substrate disposed on the first metal layer and comprising a second contact hole;

a connection line disposed in a second metal layer on the second substrate, the connection line being electrically connected to the fan-out line through the second contact hole;

a thin film transistor disposed in an active layer and a third metal layer on the second metal layer; and a flexible film disposed on a bottom surface of the first substrate, the flexible film being electrically connected to the fan-out line through the first contact hole, wherein an end of the flexible film is electrically connected to the fan-out line of the first display device, and another end of the flexible film is electrically connected to the fan-out line of the second display device.

9. The tiled display device of claim 8, wherein a first angle between a top surface of the first substrate and an inner surface of the first contact hole is less than a second angle between a top surface of the fan-out line and an inner surface of the second contact hole.

10. The tiled display device of claim 8, wherein a first angle is about 10 degrees or less, and a second angle is about 30 degrees or more.

11. The tiled display device of claim 8, wherein at least a part of the flexible film overlaps the bonding part in a thickness direction.

12. The tiled display device of claim 8, wherein the first display device comprises a gate driver or a data driver disposed on a bottom surface of the first substrate, and the second display device receives a gate signal of the gate driver or a data voltage of the data driver through the flexible film.

* * * * *